(12) United States Patent
Chang et al.

(10) Patent No.: US 11,450,268 B2
(45) Date of Patent: Sep. 20, 2022

(54) DISPLAY DEVICE AND FABRICATING METHOD FOR DISPLAY DEVICE

(71) Applicant: Samsung Display Co., Ltd., Yongin-si (KR)

(72) Inventors: Chong Sup Chang, Yongin-si (KR); Eui Kang Heo, Yongin-si (KR); Young Seok Baek, Yongin-si (KR); Ha Na Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 208 days.

(21) Appl. No.: 16/998,183

(22) Filed: Aug. 20, 2020

(65) Prior Publication Data
US 2021/0183826 A1 Jun. 17, 2021

(30) Foreign Application Priority Data
Dec. 16, 2019 (KR) .................. 10-2019-0168203

(51) Int. Cl.
*G09G 3/3225* (2016.01)
*H01L 25/075* (2006.01)
(Continued)

(52) U.S. Cl.
CPC .......... *G09G 3/3225* (2013.01); *H01L 22/14* (2013.01); *H01L 24/24* (2013.01);
(Continued)

(58) Field of Classification Search
CPC ..... H01L 25/0753; H01L 22/14; H01L 24/24; H01L 25/167; H01L 2224/24011; H01L 2224/24226; H01L 2224/24227; H01L 33/62; H01L 27/3248; H01L 27/15; H01L 27/3262; H01L 27/3279; H01L 33/385; H01L 51/5203; H01L 27/156; H01L 27/124; H01L 33/005; G09G 3/3225;
(Continued)

(56) References Cited

U.S. PATENT DOCUMENTS

2018/0175104 A1* 6/2018 Kang ................. H01L 33/405
2018/0175106 A1* 6/2018 Kim .................. H01L 33/20
(Continued)

FOREIGN PATENT DOCUMENTS

KR 10-2019-0029831 A 3/2019

*Primary Examiner* — Premal R Patel
(74) *Attorney, Agent, or Firm* — Lewis Roca Rothgerber Christie LLP

(57) ABSTRACT

A display device includes a substrate including a display area and a non-display area around the display area; and a display element layer on the substrate. The display element layer may include first and second electrodes extending in a first direction and spaced apart from each other in a second direction that is different from the first direction; a first light emitting element electrically coupled to the first and second electrodes; a first dummy electrode extending in the first direction and spaced apart from the first and second electrodes; second dummy electrodes spaced apart from each other in the first direction and spaced apart from the first electrode, the second electrode, and the first dummy electrode; and a second light emitting element electrically coupled to the first dummy electrode and the second dummy electrodes.

20 Claims, 24 Drawing Sheets

(51) Int. Cl.
*H01L 25/16* (2006.01)
*H01L 21/66* (2006.01)
*H01L 23/00* (2006.01)

(52) U.S. Cl.
CPC ........ *H01L 25/0753* (2013.01); *H01L 25/167* (2013.01); *G09G 2300/0413* (2013.01); *H01L 2224/24011* (2013.01); *H01L 2224/24226* (2013.01); *H01L 2224/24227* (2013.01)

(58) Field of Classification Search
CPC ..... G09G 2300/0413; G09G 2320/029; G09G 3/006; G01R 27/205; G01R 31/2635
See application file for complete search history.

(56) References Cited

U.S. PATENT DOCUMENTS

| | | | |
|---|---|---|---|
| 2019/0081261 A1 | 3/2019 | Lee et al. | |
| 2019/0206973 A1* | 7/2019 | Kim | H01L 27/3211 |
| 2021/0118959 A1* | 4/2021 | Sano | H01L 27/3218 |
| 2021/0408205 A1* | 12/2021 | Lu | H01L 51/5228 |

* cited by examiner

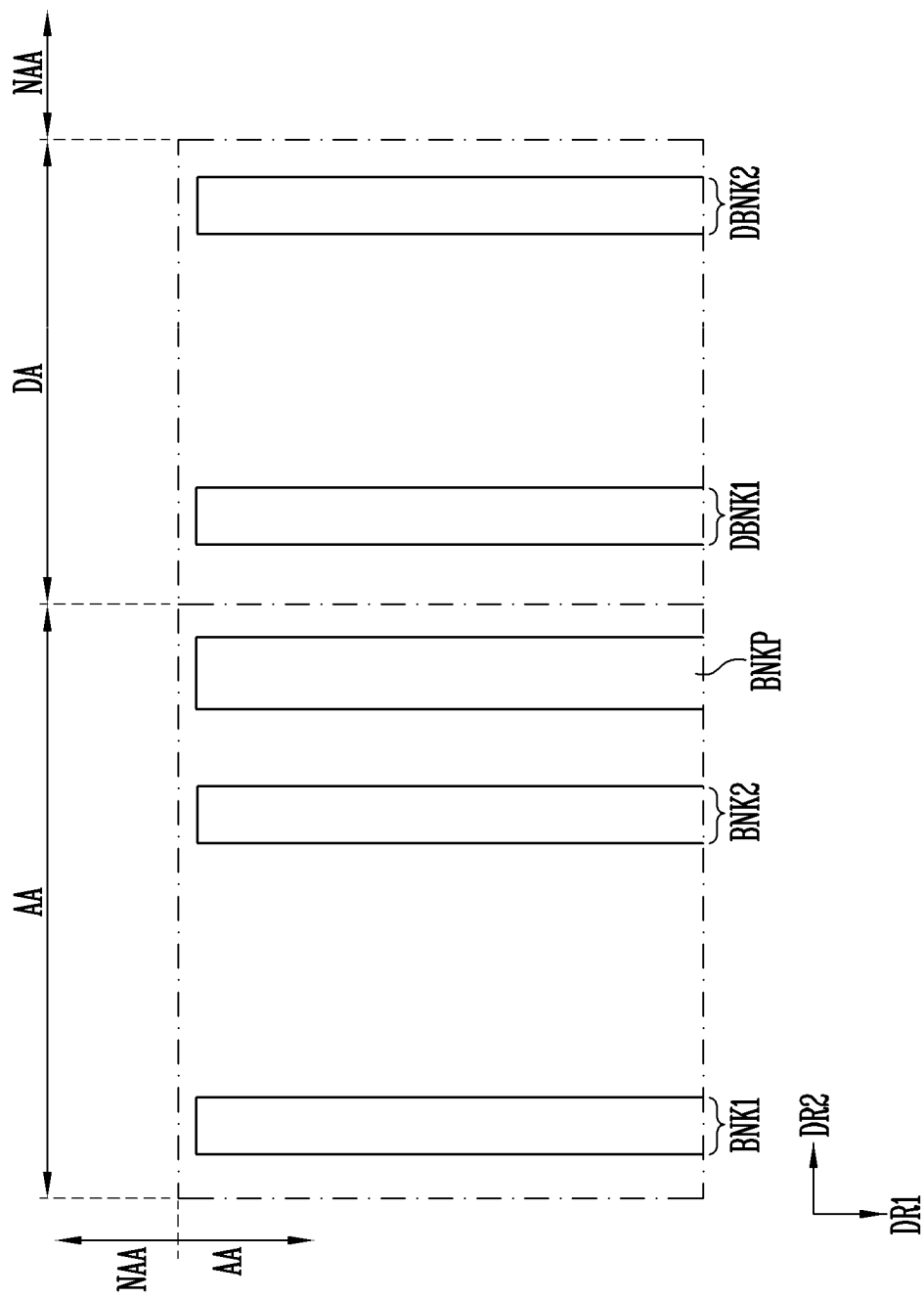

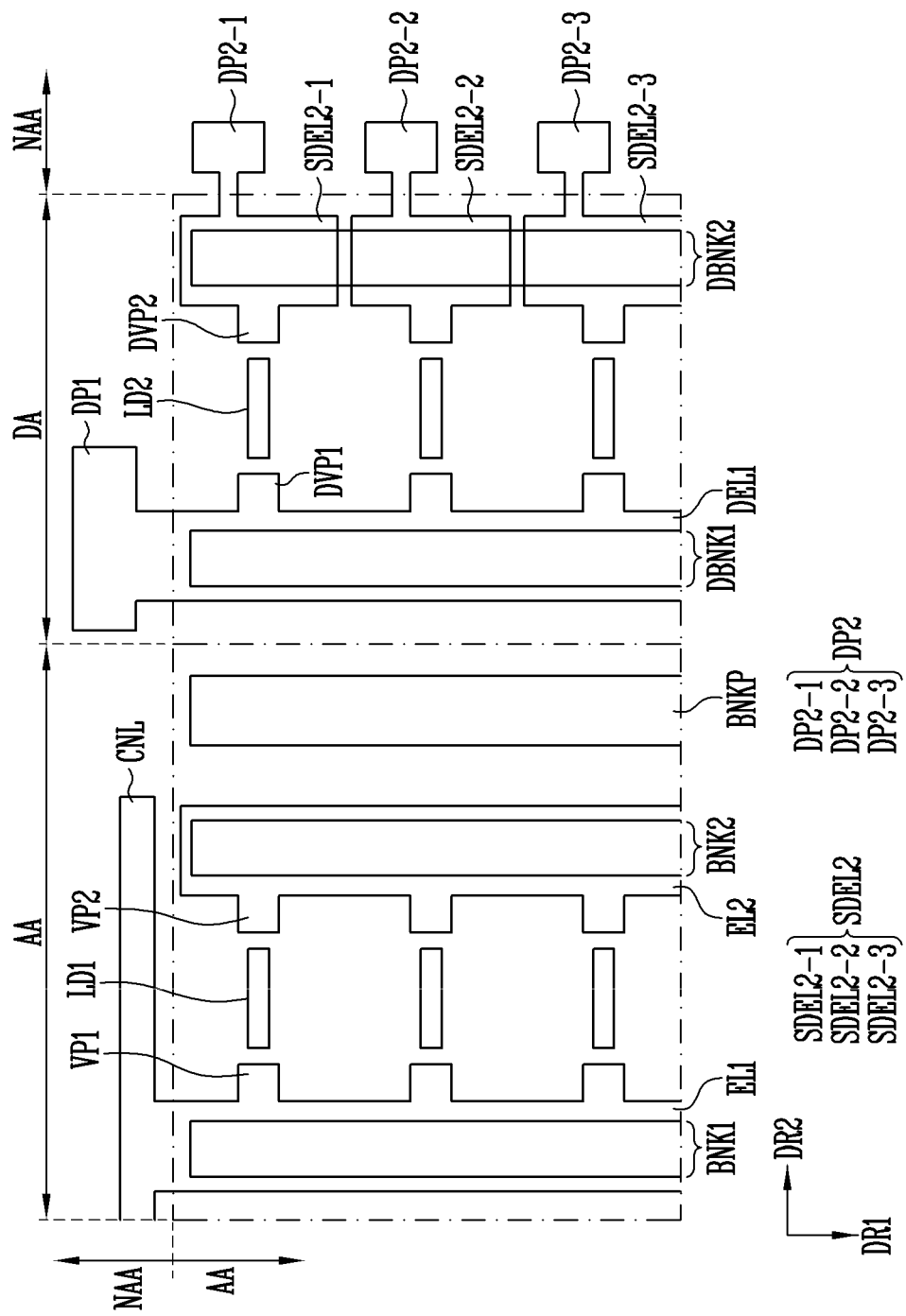

DISPLAY DEVICE AND FABRICATING METHOD FOR DISPLAY DEVICE

CROSS-REFERENCE TO RELATED APPLICATION

This application claims priority to and the benefit of Korean Patent Application No. 10-2019-0168203, filed on Dec. 16, 2019 in the Korean Intellectual Property Office, the entire disclosure of which is incorporated herein by reference.

BACKGROUND

1. Field

Aspects of embodiments of the present disclosure relate to a display device and a method of fabricating the same.

2. Description of Related Art

A light emitting diode (herein, referred to as "LED") may have relatively satisfactory durability even under poor environmental conditions, and have excellent performances in terms of lifetime and luminance. Recently, research on the technology of applying such LEDs to various display devices has become appreciably more active.

As a part of such research, technologies of fabricating a rod-type LED having a small size corresponding to the micro-scale or the nano-scale using an inorganic crystalline structure, e.g., a structure obtained by growing a nitride-based semiconductor, are being developed. For example, rod-type LEDs may be fabricated in a small enough size to form a pixel of a self-emissive display device, etc.

SUMMARY

According to aspects of various embodiments of the present disclosure, a display device that can easily measure the contact resistance of light emitting elements and a method of fabricating such a display device are provided.

According to one or more embodiments of the present disclosure, a display device includes: a substrate including a display area and a non-display area around (e.g., enclosing) the display area; and a display element layer on the substrate. The display element layer may include first and second electrodes extending in a first direction, and spaced apart from each other in a second direction that is different from the first direction; a first light emitting element electrically coupled to the first and second electrodes; a first dummy electrode extending in the first direction, and spaced apart from the first and second electrodes; second dummy electrodes spaced apart from each other in the first direction, and spaced apart from the first electrode, the second electrode, and the first dummy electrode; and a second light emitting element electrically coupled to the first dummy electrode and the second dummy electrodes. The non-display area may include a dummy area located at at least one side of the display area, the first and second electrodes and the first light emitting element may be on the display area, and the first dummy electrode, the second dummy electrodes, and the second light emitting element may be on the dummy area.

In an embodiment, the first electrode may include a first protrusion protruding towards the second electrode, the second electrode may include a second protrusion protruding towards the first electrode, and the first light emitting element may be between the first protrusion and the second protrusion.

In an embodiment, the second light emitting element may be between each of the second dummy electrodes and the first dummy electrode.

In an embodiment, the first dummy electrode may include a first dummy protrusion protruding towards each of the second dummy electrodes, and each of the second dummy electrodes may include a second dummy protrusion protruding towards the first dummy electrode.

In an embodiment, the first dummy protrusion may have a planar shape corresponding to a planar shape of the first protrusion, and the second dummy protrusion may have a planar shape corresponding to a planar shape of the second protrusion.

In an embodiment, the planar shape of the first dummy protrusion may be different from the planar shape of the first protrusion, and the planar shape of the second dummy protrusion may be different from the planar shape of the second protrusion.

In an embodiment, the second light emitting element may be between the first dummy protrusion and the second dummy protrusion.

In an embodiment, the dummy area may include sub dummy areas that are spaced apart from each other in the first direction, and the second light emitting element may be arranged in each of the sub dummy areas.

In an embodiment, a shape of the first and second dummy protrusions arranged in at least one of the sub dummy areas may be different from a shape of the first and second dummy protrusions arranged in a remaining area of the sub dummy areas.

In an embodiment, a distance between the first dummy protrusion and the second dummy protrusion arranged in at least one of the sub dummy areas to be spaced apart from each other in the second direction may be different from a distance between the first dummy protrusion and the second dummy protrusion arranged in a remaining area of the sub dummy areas to be spaced apart from each other in the second direction.

In an embodiment, a width of a portion where the first dummy protrusion arranged in at least one of the sub dummy areas faces the second dummy protrusion on a plane may be different from a width of a portion where the first dummy protrusion arranged in a remaining area of the sub dummy areas faces the second dummy protrusion on a plane.

In an embodiment, the first dummy electrode may include first sub dummy electrodes spaced apart from each other in the first direction, and the second light emitting element may be arranged between each of the first sub dummy electrodes and each of the second dummy electrodes.

In an embodiment, the display element layer may further include a first dummy pad electrically coupled to the first dummy electrode, and second dummy pads electrically coupled to the second dummy electrodes, respectively.

In an embodiment, the display element layer may further include a first dummy contact electrode covering at least a portion of the first dummy electrode, and electrically coupling the first dummy electrode to the second light emitting element; and a second dummy contact electrode covering at least a portion of the second dummy electrodes, and electrically coupling the second dummy electrodes to the second light emitting element.

According to one or more embodiments of the present disclosure, a method of fabricating a display device includes: forming, on a substrate, a first electrode, a second electrode, a first dummy electrode, and a second dummy electrode that extend in a first direction and are spaced apart from each other in a second direction different from the first direction; providing light emitting elements on the substrate including the first and second electrodes and the first and second dummy electrodes formed thereon; applying an alignment signal to the first and second electrodes to align a first light emitting element of the light emitting elements between the first and second electrodes, and applying an alignment signal to the first and second dummy electrodes to align a second light emitting element of the light emitting elements between the first and second dummy electrodes; cutting the second dummy electrodes to form second sub dummy electrodes spaced apart from each other in the first direction; forming a first dummy contact electrode that electrically couples the first dummy electrode to the second light emitting element, and a second dummy contact electrode that electrically couples the second sub dummy electrodes to the second light emitting element; and measuring contact resistance of the second light emitting element. The substrate may include a display area and a non-display area around (e.g., enclosing) the display area, the non-display area may include a dummy area located at at least one side of the display area, the first and second electrodes and the first light emitting element may be on the display area, and the first dummy electrode, the second dummy electrode, and the second light emitting element may be on the dummy area.

In an embodiment, the second light emitting element may be between each of the second sub dummy electrodes and the first dummy electrode.

In an embodiment, the forming of the first and second dummy electrodes may include forming, on the first dummy electrode, a first dummy protrusion protruding towards the second dummy electrode, and forming, on the second dummy electrode, a second dummy protrusion protruding towards the first dummy electrode.

In an embodiment, the cutting of the second dummy electrode may include cutting the second dummy electrode to provide a respective second dummy protrusion on each of the second sub dummy electrodes, and the second light emitting element may be between the first dummy protrusion and the second dummy protrusion.

In an embodiment, the forming of the first and second dummy electrodes may include forming a first dummy pad electrically coupled to the first dummy electrode, and second dummy pads electrically coupled to the second dummy electrode. The cutting of the second dummy electrode may include cutting the second dummy electrode to provide a respective second dummy pad on each of the second sub dummy electrodes.

In an embodiment, the measuring of the contact resistance of the second light emitting element may include applying a test signal to each of the first dummy pad and the second dummy pads, and measuring a signal outputted from the second light emitting element.

BRIEF DESCRIPTION OF THE DRAWINGS

FIGS. 18A to 18G are plan views illustrating a method of fabricating a display device in accordance with an embodiment of the present disclosure.

DETAILED DESCRIPTION

Figure 1A:
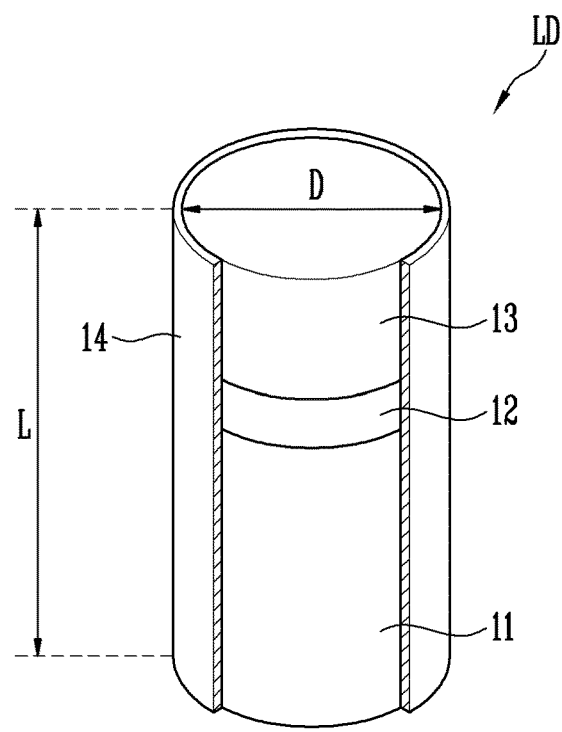
FIGS. 1A and 1B are perspective views illustrating a light emitting element in accordance with some embodiments of the present disclosure.

As the present disclosure allows for various changes and numerous embodiments, some example embodiments will be illustrated in the drawings and described in further detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It is to be understood that, although the terms "first," "second," etc. may be used herein to describe various elements, these elements should not be limited by these terms. These terms are used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It is to be further understood that the terms "comprise," "include," "have," etc. when used in this specification, specify the presence of stated features, integers, steps, operations, elements, components, and/or combinations thereof, but do not preclude the presence or addition of one or more other features, integers, steps, operations, elements, components, and/or combinations thereof. Further, when a first part, such as a layer, a film, a region, or a plate, is disposed on a second part, the first part may be not only directly on the second part, but one or more third parts may intervene therebetween. In addition, when it is expressed that a first part, such as a layer, a film, a region, or a plate, is formed on a second part, the surface of the second part on which the first part is formed is not limited to an upper surface of the second part but may include other surfaces such as a side surface or a lower surface of the second part. Also, when a first part, such as a layer, a film, a region, or a plate, is under a second part, the first part may be not only directly under the second part but one or more third parts may intervene therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Some embodiments of the present disclosure will herein be described in further detail with reference to the accompanying drawings.

Figure 1B:
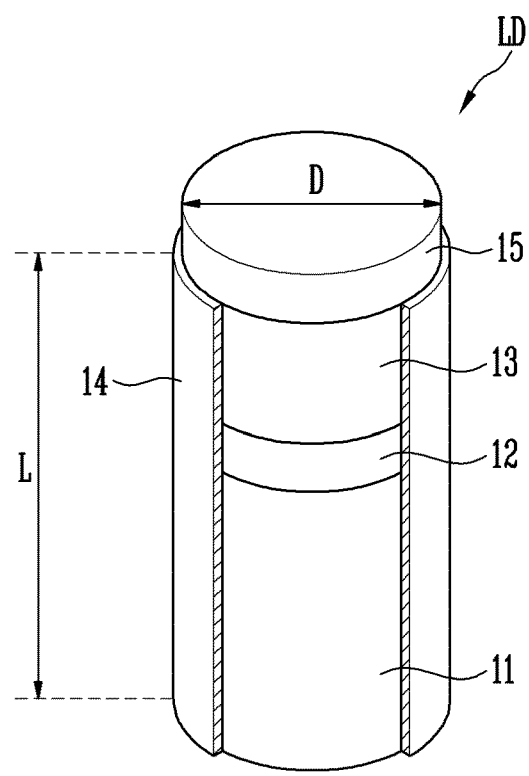

FIGS. 1A and 1B are perspective views illustrating a light emitting element in accordance with some embodiments of the present disclosure. Although FIGS. 1A and 1B illustrate a cylindrical light emitting element LD, the present disclosure is not limited thereto.

Referring to FIGS. 1A and 1B, the light emitting element LD in accordance with some embodiments of the present disclosure may include a first semiconductor layer 11, a second semiconductor layer 13, and an active layer 12 interposed between the first semiconductor layer 11 and the second semiconductor layer 13.

For example, the light emitting element LD may be implemented as a stack formed by successively stacking the first semiconductor layer 11, the active layer 12, and the second semiconductor layer 13.

In an embodiment of the present disclosure, the light emitting element LD may be provided in the form of a rod extending in a direction. If the direction in which the light emitting element LD extends is defined as the longitudinal direction, the light emitting element LD may have one end and the other end in the longitudinal direction.

In an embodiment of the present disclosure, one of the first and second semiconductor layers 11 and 13 may be disposed on one end (e.g., a first portion), and the other of the first and second semiconductor layers 11 and 13 may be disposed on the other end (e.g., a second portion).

The light emitting element LD may have any of various shapes. For example, the light emitting element LD may have a rod-like shape or a bar-like shape extending in the longitudinal direction (e.g., to have an aspect ratio greater than 1). In an embodiment of the present disclosure, a length L of the light emitting element LD with respect to the longitudinal direction may be greater than a diameter D (or a width of a cross-section) thereof. The light emitting element LD may include a light emitting diode fabricated to have a small size, e.g., with a length L and/or a diameter D corresponding to a micro scale or a nano scale. In various embodiments of the present disclosure, the shape of the light emitting element LD may be changed or selected so as to meet requirements (or design conditions) of a lighting device or a self-emissive display device.

The first semiconductor layer 11 may include, for example, at least one n-type semiconductor layer. For example, the first semiconductor layer 11 may include a semiconductor layer which includes any semiconductor material of InAlGaN, GaN, AlGaN, InGaN, AlN, and InN, and is doped with a first conductive dopant, such as Si, Ge, or Sn.

However, the material forming the first semiconductor layer 11 is not limited thereto, and the first semiconductor layer 11 may be formed of any of various other materials.

The active layer 12 may be formed on the first semiconductor layer 11 and have a single or multiple quantum well structure. In various embodiments of the present disclosure, a cladding layer (not shown) doped with a conductive dopant may be formed on and/or under the active layer 12. For example, the cladding layer may be formed of an ALGaN layer or an InALGaN layer. In addition, material such as AlGaN or AlInGaN may be used to form the active layer 12.

If an electric field of a certain voltage (e.g., a predetermined voltage) or more is applied to the opposite ends of the light emitting element LD, the light emitting element LD emits light by coupling of electron-hole pairs in the active layer 12.

The second semiconductor layer 13 may be provided on the active layer 12 and include a semiconductor layer of a type different from that of the first semiconductor layer 11. For example, the second semiconductor layer 13 may include at least one p-type semiconductor layer. For example, the second semiconductor layer 13 may include a semiconductor layer which includes any semiconductor material of InAlGaN, GaN, AlGaN, InGaN, AlN, and InN, and is doped with a second conductive dopant, such as Mg.

However, the material forming the second semiconductor layer 13 is not limited thereto, and the second semiconductor layer 13 may be formed of any of various other materials.

In an embodiment of the present disclosure, the light emitting element LD may not only include the first semiconductor layer 11, the active layer 12, and the second semiconductor layer 13, but may also include a fluorescent layer, another active layer, another semiconductor layer, and/or an electrode provided on and/or under each layer.

In an embodiment, the light emitting element LD may further include at least one electrode disposed on an end (e.g., an upper surface) of the second semiconductor layer 13 or an end (e.g., a lower surface) of the first semiconductor layer 11.

For example, as illustrated in FIG. 1B, the light emitting element LD may further include an electrode 15 disposed on an end of the second semiconductor layer 13. The electrode 15 may be an ohmic contact electrode, but is not limited thereto. According to an embodiment, the electrode 15 may be a Schottky contact electrode. Further, the electrode 15 may include a metal or a metal oxide. For example, chromium (Cr), titanium (Ti), aluminum (Al), gold (Au), nickel (Ni), ITO, and an oxide or alloy thereof may be used alone or in combination with each other. However, the present disclosure is not limited thereto. In an embodiment, the electrode 15 may be substantially transparent or translucent. Thereby, light generated from the light emitting element LD may be emitted to the outside of the light emitting element LD after passing through the electrode 15.

In an embodiment, the light emitting element LD may further include an insulating layer 14. However, in an embodiment of the present disclosure, the insulating layer 14 may be omitted, or may be provided to cover only some of the first semiconductor layer 11, the active layer 12, and the second semiconductor layer 13.

For example, the insulating layer 14 may be provided on a portion of the light emitting element LD, other than the opposite ends thereof, such that the opposite ends of the light emitting element LD may be exposed.

For convenience of explanation, FIGS. 1A and 1B illustrate the insulating layer 14, a portion of which has been removed. In an embodiment, the entirety of the side surface of the light emitting element LD may be enclosed by the insulating layer 14.

The insulating layer 14 may be provided to enclose at least a portion of an outer circumferential surface of the first semiconductor layer 11, the active layer 12, and/or the second semiconductor layer 13. For example, the insulating layer 14 may be provided to enclose at least the outer circumferential surface of the active layer 12. In a case in which the light emitting element LD includes the electrode 15, the insulating layer 14 may enclose at least a portion of the outer circumferential surface of the electrode 15.

In an embodiment of the present disclosure, the insulating layer 14 may include a transparent insulating material. For example, the insulating layer 14 may include at least one insulating material selected from the group consisting of $SiO_2$, $Si_3N_4$, $Al_2O_3$, and $TiO_2$, but is not limited thereto. In other words, any of various materials having insulating properties may be used.

If the insulating layer 14 is provided on the light emitting element LD, the active layer 12 may be prevented or substantially prevented from short-circuiting with a first and/or second electrode (not illustrated).

Further, due to the insulating layer 14, occurrence of a defect on the surface of the light emitting element LD may be minimized or reduced, whereby the lifetime and efficiency of the light emitting element LD may be improved. In a case in which a plurality of light emitting elements LD are disposed in close contact with each other, the insulating layer 14 may prevent or substantially prevent an undesired short circuit from occurring between the light emitting elements LD.

The light emitting element LD may be employed as a light source for various display devices. For example, the light emitting element LD may be used as a light source element for a lighting apparatus or a self-emissive display device.

Figure 2A:
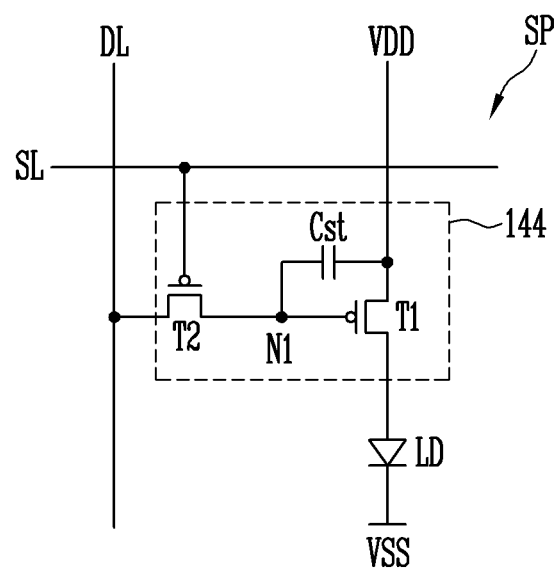
FIGS. 2A and 2B are circuit diagrams illustrating a unit emission area of a display device in accordance with some embodiments of the present disclosure.
Figure 2B:
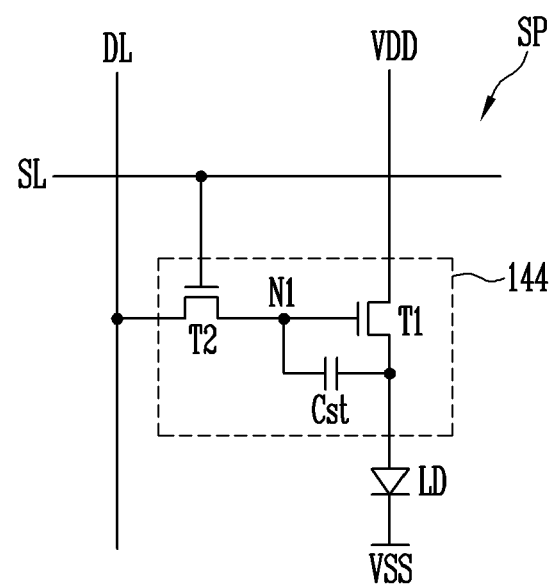

FIGS. 2A and 2B are circuit diagrams illustrating a unit emission area of a display device in accordance with some embodiments of the present disclosure.

FIGS. 2A and 2B illustrate examples of a pixel that forms an active emission display panel. In an embodiment of the present disclosure, the unit emission area may be a pixel area in which a single sub-pixel is provided.

Referring to FIG. 2A, a sub-pixel SP may include at least one light emitting element LD, and a pixel driving circuit 144 which is coupled to the light emitting element LD and configured to drive the light emitting element LD.

The light emitting element LD may include a first electrode (e.g., an anode electrode) coupled to a first driving power supply VDD via the pixel driving circuit 144, and a second electrode (e.g., a cathode electrode) coupled to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting element LD.

Each of the light emitting elements LD may emit light at a luminance corresponding to a driving current which is controlled by the pixel driving circuit 144.

Although FIG. 2A illustrates an embodiment in which each of the sub-pixels SP includes only one light emitting element LD, the present disclosure is not limited thereto. For example, the sub-pixel SP may include a plurality of light emitting elements LD coupled in parallel to each other.

In an embodiment of the present disclosure, the pixel driving circuit 144 may include a first transistor T1, a second transistor T2, and a storage capacitor Cst. However, the structure of the pixel driving circuit 144 is not limited to the embodiment illustrated in FIG. 2A.

A first electrode of the first transistor T1 (driving transistor) is coupled to the first driving power supply VDD, and a second electrode thereof is electrically coupled to the first electrode of each of the light emitting elements LD. A gate electrode of the first transistor T1 is coupled to a first node N1. As such, the first transistor T1 may control the amount of driving current to be supplied to the light emitting elements LD in response to the voltage of the first node N1.

A first electrode of the second transistor T2 (switching transistor) is coupled to a data line DL, and a second electrode thereof is coupled to the first node N1. Here, the first electrode and the second electrode of the second transistor T2 may be different electrodes. For example, if the first electrode is a source electrode, the second electrode may be a drain electrode. A gate electrode of the second transistor T2 is coupled to a scan line SL.

When a scan signal having a voltage (e.g., a low-level voltage) capable of turning on the second transistor T2 is supplied from the scan line SL, the second transistor T2 is turned on to electrically couple the data line DL with the first node N1. Here, a data signal of a corresponding frame is supplied to the data line DL, such that the data signal is transmitted to the first node N1. The data signal transmitted to the first node N1 is charged in the storage capacitor Cst.

One electrode of the storage capacitor Cst is coupled to the first driving power supply VDD, and the other electrode thereof is coupled to the first node N1. The storage capacitor Cst may charge a voltage corresponding to the data signal supplied to the first node N1, and maintain the charged voltage until a data signal of a subsequent frame is supplied.

For convenience of explanation, FIG. 2A illustrates the pixel driving circuit 144 having a relatively simple structure including the second transistor T2 configured to transmit the data signal to the sub-pixel SP, the storage capacitor Cst configured to store the data signal, and the first transistor T1 configured to supply driving current corresponding to the data signal to the light emitting element LD.

However, the present disclosure is not limited thereto, and the structure of the pixel driving circuit 144 may be changed in various ways. For example, the pixel driving circuit 144 may further include at least one transistor element, such as a transistor element configured to compensate for the threshold voltage of the first transistor T1, a transistor element configured to initialize the first node N1, and/or a transistor element configured to control an emission time of the light emitting elements LD, or other circuit elements such as a boosting capacitor for boosting the voltage of the first node N1.

Further, although in FIG. 2A, the transistors, e.g., the first and second transistors T1 and T2, included in the pixel driving circuit 144 have been illustrated as being formed of P-type transistors, the present disclosure is not limited thereto. In other words, at least one of the first and second transistors T1 and T2 included in the pixel driving circuit 144 may be an N-type transistor.

Referring to FIG. 2B, in an embodiment of the present disclosure, the first and second transistors T1 and T2 may be implemented as N-type transistors. The configuration and operation of the pixel driving circuit 144 illustrated in FIG. 2B, other than a change in connection positions of some components due to a change in the type of transistor, are similar to those of the pixel driving circuit 144 of FIG. 2A. Therefore, further detailed descriptions related thereto will be omitted.

Figure 3:
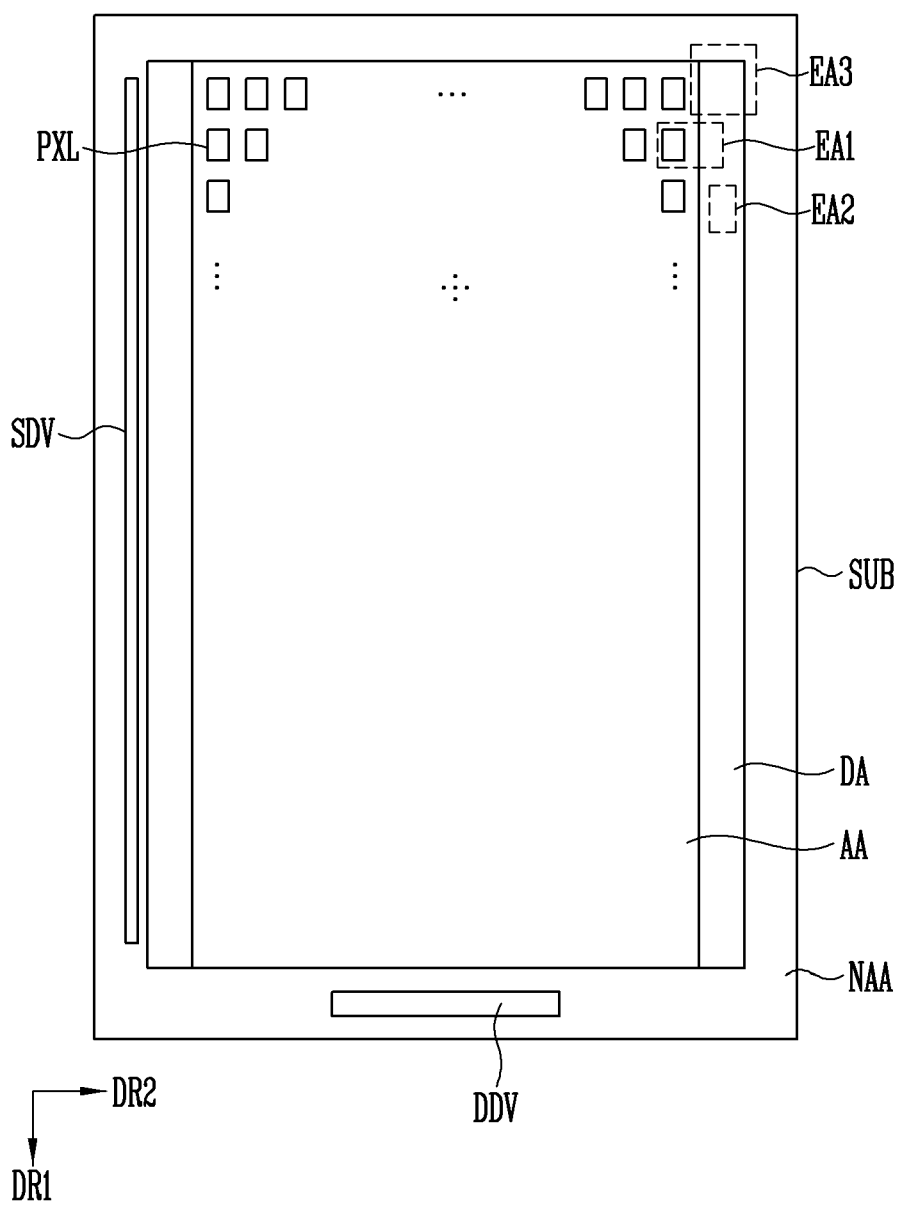
FIG. 3 is a plan view illustrating a display device in accordance with an embodiment of the present disclosure.

FIG. 3 is a plan view illustrating a display device in accordance with an embodiment of the present disclosure. Particularly, FIG. 3 is a schematic plan view illustrating a display device that uses the light emitting element LD illustrated in FIG. 1A or 1B as a light source.

Referring to FIGS. 1A, 1B, and 3, a display device in accordance with an embodiment of the present disclosure may include a substrate SUB, pixels PXL which are provided on a surface of the substrate SUB, a driver (not illustrated) which is provided on the substrate SUB and configured to drive the pixels PXL, and a line component (not illustrated) which couples the pixels PXL with the driver.

The display device may be a passive-matrix type display device or an active-matrix type display device, according to a method of driving the light emitting element LD. For example, in a case in which the display device is implemented as the active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been utilized. However, the present disclosure is not limited thereto. For example, passive-matrix type display devices in which pixels PXL may be turned on by groups may also employ components (e.g., first and second electrodes) for driving the light emitting element LD.

The substrate SUB may include a display area AA and a non-display area NAA. The display area AA is an area in which pixels PXL displaying an image are provided, and may be referred to as an active area. In various embodiments, each of the pixels PX may include at least one light emitting element LD. The light emitting element LD may be an organic light emitting diode or a small-sized inorganic light emitting diode having a micro- or nano-scale size, but the present disclosure is not limited thereto. The display device may drive pixels PX in response to image data input from an external device, thus displaying an image on the display area AA.

The non-display area NAA is an area which is disposed around the display area AA, and may be referred to as a non-active area. In various embodiments, the non-display area NAA may comprehensively mean areas other than the display area AA on the substrate SUB. In an embodiment, as illustrated in FIG. 3, the non-display area NAA may enclose the display area AA.

The non-display area NAA may be an area in which the driver for driving the pixels PXL and some of the line component for coupling the pixels PXL to the driver are provided.

In various embodiments of the present disclosure, the non-display area NAA may include a dummy area DA. The dummy area DA may be located at at least one side of the display area AA. Referring to FIG. 3, although the dummy area DA may be located at each of left and right sides of the display area AA, a position at which the dummy area DA is provided is not limited thereto. For example, the dummy area DA may be located only on the left side of the display area AA, or located only on the right side of the display area AA.

The pixels PXL may be provided in the display area AA on the substrate SUB. Each of the pixels PXL refers to a unit for displaying an image, and a plurality of pixels may be provided. Each of the pixels PXL may include a light emitting element LD which emits white light and/or color light. Each pixel PXL may emit light having any one color among red, green, and blue, but is not limited thereto. For example, each of the pixels PXL may emit light having any one color among cyan, magenta, yellow, and white.

The pixels PXL may be arranged in a matrix form along columns extending in a first direction DR1 and rows extending in a second direction DR2 intersecting with the first direction DR1. However, the arrangement of the pixels PXL is not limited to a particular arrangement. In other words, the pixels PXL may be arranged in any of various forms.

The driver may provide a signal to each pixel PXL through the line component and thus control the operation of the pixel PXL. In FIG. 3, the line component is omitted for the sake of explanation.

The drivers may include a scan driver SDV configured to provide scan signals to the pixels PXL through scan lines, an emission driver (not illustrated) configured to provide emission control signals to the pixels PXL through emission control lines, a data driver DDV configured to provide data signals to the pixels PXL through data lines, and a timing controller (not illustrated). The timing controller may control the scan driver SDV, the emission driver, and the data driver DDV.

The display device in accordance with an embodiment of the present disclosure may be employed in any of various electronic devices. For example, the display device may be applied to a television, a notebook computer, a cellular phone, a smartphone, a smartpad, a portable multimedia player (PMP), a personal digital assistant (PDA), a navigation device, various kinds of wearable devices such as a smartwatch, etc.

Figure 4:
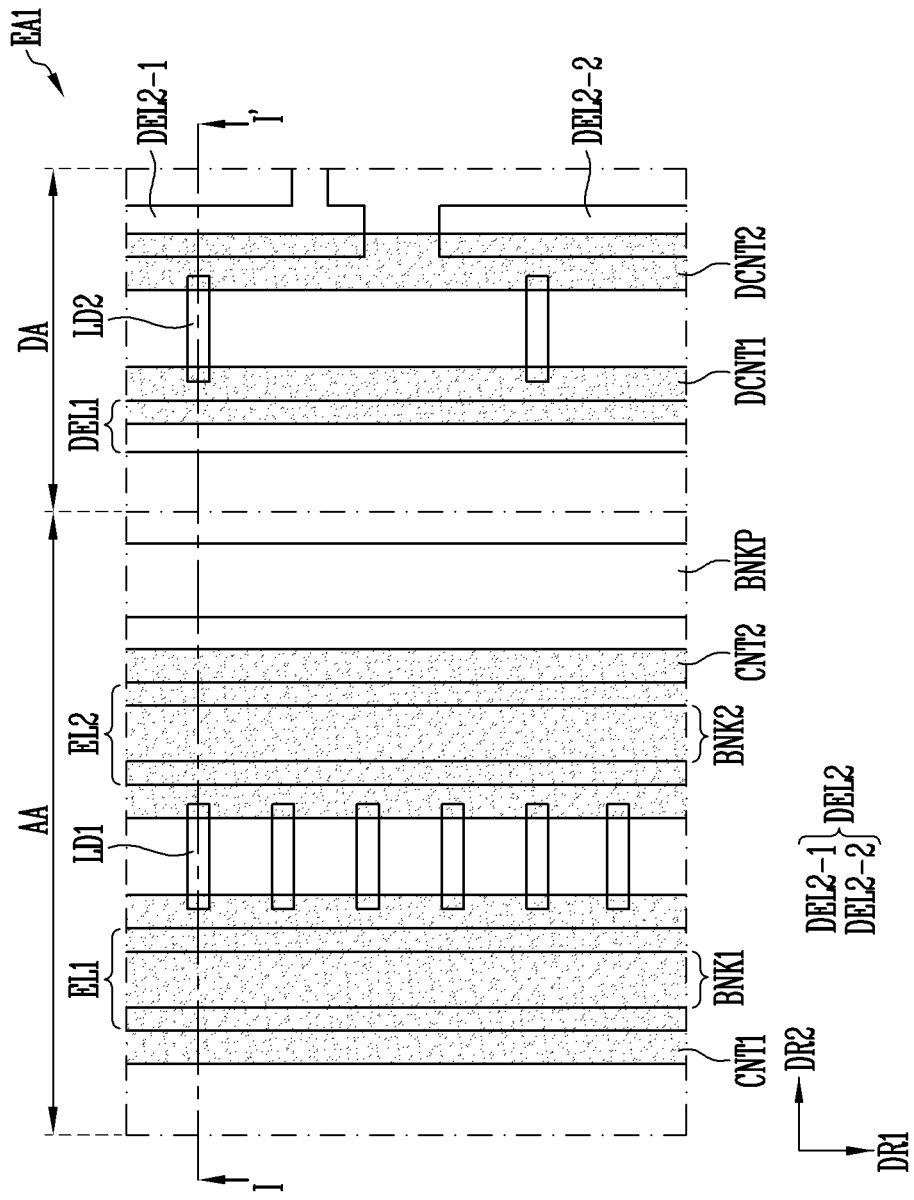
FIG. 4 is a plan view schematically illustrating an embodiment of a display element layer in which a region "EA1" of FIG. 3 is enlarged.
Figure 5:
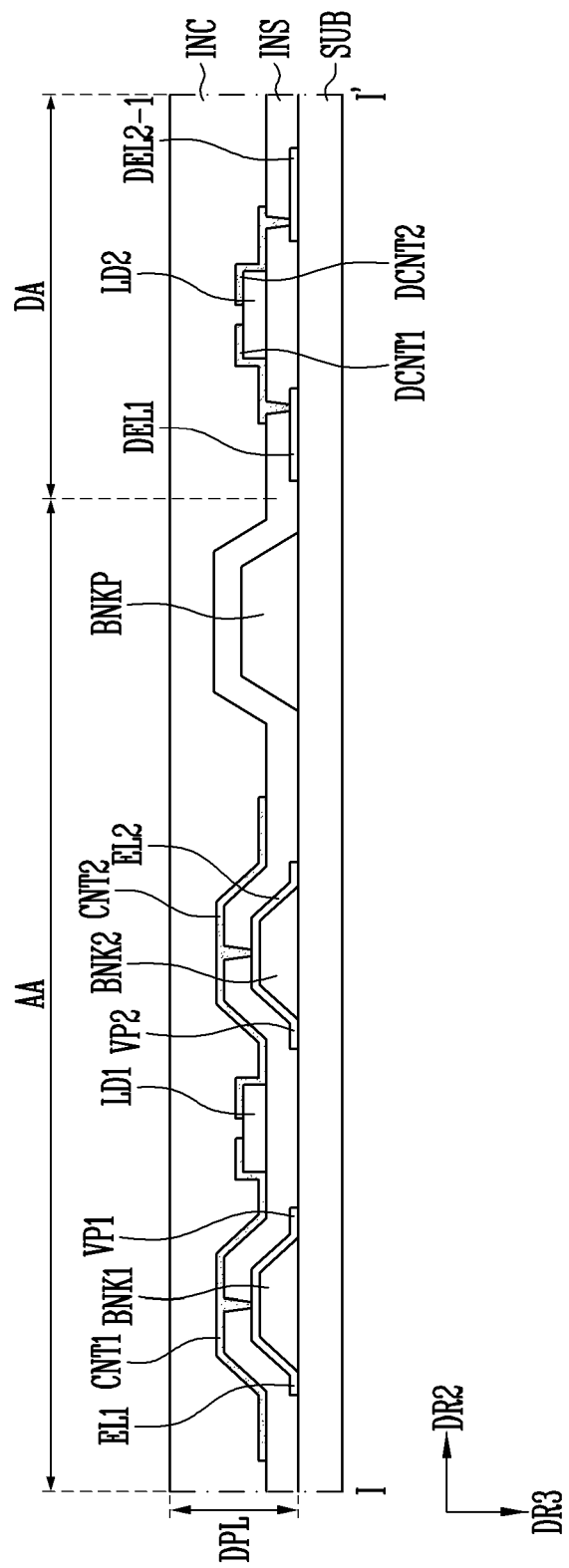
FIG. 5 is a cross-sectional view taken along the line I-I' of FIG. 4.

FIG. 4 is a plan view schematically illustrating an embodiment of a display element layer in which a region "EA1" of FIG. 3 is enlarged; and FIG. 5 is a cross-sectional view taken along the line I-I' of FIG. 4.

Although it is shown in FIG. 4 that first and second light emitting elements LD1 and LD2 are arranged in parallel in the second direction DR2, the arrangement of the first and second light emitting elements LD1 and LD2 is not limited thereto. For example, the first light emitting element LD1 may be aligned between first and second electrodes EL1 and EL2 to be inclined at an angle (e.g., a predetermined angle) with respect to the second direction DR2. Further, the second light emitting element LD2 may be aligned between a first dummy electrode DEL1 and second dummy electrodes DEL2 to be inclined at an angle (e.g., a predetermined angle) with respect to the second direction DR2.

Herein, the first and second light emitting elements LD1 and LD2 may be collectively referred to as light emitting elements LD.

As illustrated in FIGS. 4 and 5, a display element layer DPL in accordance with an embodiment of the present disclosure may include first and second banks BNK1 and BNK2 provided on the substrate SUB, the first and second electrodes EL1 and EL2, the first light emitting element LD1, first and second contact electrodes CNT1 and CNT2, a bank pattern BNKP, the first dummy electrode DEL1, the second dummy electrodes DEL2, the second light emitting element LD2, and first and second dummy contact electrodes DCNT1 and DCNT2.

The substrate SUB may be a rigid substrate or a flexible substrate.

Examples of the rigid substrate may include a glass substrate, a quartz substrate, a glass ceramic substrate, and a crystalline glass substrate.

Examples of the flexible substrate may include a film substrate and a plastic substrate, each of which includes polymer organic material. For example, the flexible substrate may include any of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In an embodiment, the flexible substrate may include fiber glass reinforced plastic (FRP).

In an embodiment, a material applied to the substrate SUB may have resistance (thermal resistance) to high treatment temperatures during a process of fabricating the display device. In some various embodiments of the present disclosure, the entirety or at least a portion of the substrate SUB may have flexibility.

The display element layer DPL may include a buffer layer provided on the substrate SUB. For example, the first and second banks BNK1 and BNK2, the first and second electrodes EL1 and EL2, the first light emitting element LD1, the first and second contact electrodes CNT1 and CNT2, the bank pattern BNKP, the first dummy electrode DEL1, the second dummy electrodes DEL2, the second light emitting element LD2, and the first and second dummy contact electrodes DCNT1 and DCNT2 may be provided on the buffer layer.

The buffer layer may prevent or substantially prevent impurities from diffusing into the first and second light emitting elements LD1 and LD2. The buffer layer may be provided in a single layer structure or a multilayer structure having at least two or more layers. In a case in which the buffer layer has a multilayer structure, the respective layers may be formed of a same material or different materials. In an embodiment, the buffer layer may be omitted depending, for example, on the material of the substrate SUB or processing conditions.

In various embodiments of the present disclosure, the display element layer DPL may include the first and second banks BNK1 and BNK2 provided on the substrate SUB.

As illustrated in FIG. 4, the first and second banks BNK1 and BNK2 may extend in the first direction DR1, may be provided on the display area AA of the substrate SUB while being spaced apart from each other in the second direction DR2, and may form unit emission areas.

Two banks BNK1 and BNK2 that are adjacent to each other on the substrate SUB may be spaced apart from each other by a distance (e.g., a predetermined distance) in the second direction DR2. For example, the two first and second banks BNK1 and BNK2 adjacent to each other may be provided on the substrate SUB to be spaced apart from each other by a length of the first light emitting element LD1.

The first and second banks BNK1 and BNK2 may include an inorganic insulating layer made of an inorganic material or an organic insulating layer made of an organic material. According to an embodiment, the first and second banks BNK1 and BNK2 may include a single organic insulating layer and/or a single inorganic insulating layer, but the present disclosure is not limited thereto. According to an embodiment, the first and second banks BNK1 and BNK2 may be provided in the form of a multilayer structure by stacking at least one organic insulating layer and at least one inorganic insulating layer. However, the material of the first and second banks BNK1 and BNK2 is not limited to the above-described embodiments. According to an embodiment, the first and second banks BNK1 and BNK2 may include a conductive material.

As illustrated in FIG. 5, the first and second banks BNK1 and BNK2 each may have a cross-section of a trapezoid which is reduced in width from the bottom to the top in a third direction DR3, but is not limited thereto. In another embodiment, the first and second banks BNK1 and BNK2 each may have a curved surface having a semi-circular or a semi-elliptical cross-section which is reduced in width from the bottom to the top. In the present disclosure, the shape and/or the inclination of each of the first and second banks BNK1 and BNK2 may be changed in various ways, rather than being particularly limited.

On the substrate SUB, the first electrode EL1 and the second electrode EL2 may extend in the first direction DR1, and may be spaced apart from each other in the second direction DR2. The first light emitting element LD1 may be electrically coupled to the first and second electrodes EL1 and EL2.

Referring to FIGS. 4 and 5, the first electrode EL1 may be provided on the first bank BNK1, and the second electrode EL2 may be provided on the second bank BNK2. Here, the first electrode EL1 may have a shape corresponding to the inclination of the first bank BNK1, and the second electrode EL2 may have a shape corresponding to the inclination of the second bank BNK2. For example, each of the first and second electrodes EU and EL2 may include a protruding portion corresponding to the first and second banks BNK1 and BNK2, and a flat portion corresponding to the substrate SUB.

In various embodiments of the present disclosure, the first electrode EL1 and the second electrode EL2 each may be a reflective electrode. Each of the first and second electrodes EL1 and EL2 that are the reflective electrode may guide light, emitted from the first light emitting element LD1, from the substrate SUB towards the display element layer DPL (e.g., a front surface).

The first and second banks BNK1 and BNK2 and the first and second electrodes EL1 and EL2 each may function as a reflective member that guides light emitted from the first light emitting element LD1 in a desired direction to improve the light efficiency of the display device. That is, the first and second banks BNK1 and BNK2 and the first and second electrodes EL1 and EL2 each may function as a reflective member that guides light emitted from the first light emitting element LD1 towards the front of the display device (e.g., in an image display direction) to improve the light output efficiency of the first light emitting element LD1.

In an embodiment, the first electrode EU and the second electrode EL2, each of which is a reflective electrode, may include a conductive material having high light reflectivity. In an embodiment, the conductive material having the high light reflectivity may include a metal, for example, any of Ag, Mg, Al, Pt, Pd, Au, Ni, Nd, Ir, Cr, Ti, and an alloy thereof.

In an embodiment, each of the first and second electrodes EL1 and EL2 may include a transparent conductive material. The transparent conductive material may include a conductive oxide, such as indium tin oxide (ITO), indium zinc oxide (IZO), zinc oxide (ZnO), or indium tin zinc oxide (ITZO), or a conductive polymer such as PEDOT. In an embodiment, when each of the first and second electrodes EL1 and EL2 includes the transparent conductive material, a separate conductive layer made of an opaque metal so as to reflect the light emitted from the first light emitting element LD1 towards the front of the display device (e.g., in the image display direction) may be further included. However, the material of the first electrode EL1 and the second electrode EL2 is not limited to the above-mentioned materials.

In various embodiments of the present disclosure, a bank pattern BNKP may be provided in a peripheral area of a pixel area of each pixel PXL.

The bank pattern BNKP may enclose at least one side of the peripheral area included in the pixel area of each of the pixels PXL. The bank pattern BNKP may be a structure that defines (or partitions) each pixel PXL and the emission area of each of the pixels PXL adjacent thereto. An example of the bank pattern may be a pixel defining layer. Such a bank pattern BNKP may include at least one light shielding material and/or reflective material, thus preventing or substantially preventing light from leaking between each pixel PXL and the pixels PXL adjacent thereto. According to an embodiment, in order to further improve the efficiency of the light emitted from each pixel PXL, a reflective material layer may be formed on the bank pattern BNKP. According to an embodiment, the bank pattern BNKP may be formed on a layer different from or equal to the first and second banks BNK1 and BNK2.

In various embodiments of the present disclosure, the display element layer DPL may include an insulating layer INS to cover the first and second electrodes EU and EL2, the first dummy electrode DEL1, and the second dummy electrodes DEL2. The insulating layer INS may be provided on a surface of the substrate SUB including the first and second banks BNK1 and BNK2, the bank pattern BNKP, the first and second electrodes EL1 and EL2, and the first dummy electrode DEL1 and the second dummy electrodes DEL2. The first and second electrodes EL1 and EL2, the first dummy electrode DEL1 and the second dummy electrodes DEL2 may be covered by the insulating layer INS, such that the first and second electrodes EL1 and EL2, the first dummy electrode DEL1 and the second dummy electrodes DEL2 may not be affected by static electricity introduced from an external device.

The insulating layer INS may be provided to include an organic insulating layer, an inorganic insulating layer, or an organic insulating layer disposed on an inorganic insulating layer. In an embodiment, the inorganic insulating layer may include at least one of silicon oxide SiOx, silicon nitride SiNx, silicon oxynitride SiON, and a metal oxide, such as AlOx. The organic insulating layer may include an organic insulating material that may transmit light.

The organic insulating layer may include, for example, at least one of a polyacrylate resin, an epoxy resin, a phenolic resin, a polyamide resin, a polyimide rein, an unsaturated polyester resin, a poly-phenylene ether resin, a poly-phenylene sulfide resin, and a benzocyclobutene resin.

In various embodiments of the present disclosure, the insulating layer INS may be formed of an inorganic insulating layer to protect the first and second light emitting elements LD1 and LD2 from a pixel circuit layer (not shown) of each pixel PXL. However, the present disclosure is not limited thereto. According to an embodiment, the insulating layer INS may be formed of an organic insulating layer to planarize support surfaces of the first and second light emitting devices LD1 and LD2.

The first light emitting element LD1 may be provided between the first electrode EL1 and the second electrode EL2 on the insulating layer INS. That is, the first light emitting element LD1 may be provided on a layer different from the first and second electrodes EL1 and EL2.

In the description of embodiments of the present disclosure, "components are provided and/or formed on the same layer" may mean that the components are formed through a same process, and "components are provided and/or formed on different layers" may mean that the components are formed through different processes.

In various embodiments of the present disclosure, the display element layer DPL may include the first contact electrode CNT1 that electrically couples the first electrode EL1 to the first light emitting element LD1, and the second contact electrode CNT2 that electrically couples the second electrode EL2 to the first light emitting element LD1.

As illustrated in FIGS. 4 and 5, the first and second contact electrodes CNT1 and CNT2 and the first light emitting element LD1 may be provided on the insulating layer INS. Through a contact hole formed through the insulating layer INS, the first contact electrode CNT1 and the first electrode EL1 may be coupled to each other, and the second contact electrode CNT2 and the second electrode EL2 may be coupled to each other.

Although not shown in FIG. 5, the insulating layer INS may include a first opening (not illustrated) that exposes a portion of the first electrode EL1, and a second opening (not illustrated) that exposes a portion of the second electrode EL2. Here, the first contact electrode CNT1 may be provided in the first opening and may come into contact with the first electrode EU exposed through the first opening, and the second contact electrode CNT2 may be provided in the second opening and may come into contact with the second electrode EL2 exposed through the second opening.

Although it is illustrated in FIG. 5 that the first and second contact electrodes CNT1 and CNT2 are provided on a same layer of the insulating layer INS, in an embodiment, the first and second contact electrodes CNT1 and CNT2 may be provided on different layers. In an embodiment, the first and second contact electrodes CNT1 and CNT2 may be provided on the different layers, and a separate insulating layer may be provided between the first contact electrode CNT1 and the second contact electrode CNT2.

The first contact electrode CNT1 may be provided on one end of the first light emitting element LD1, and the second contact electrode CNT2 may be provided on the other end thereof. Thereby, the first light emitting element LD1 may be electrically coupled to the first and second electrodes EL1 and EL2.

The first and second contact electrodes CNT1 and CNT2 may include at least one of various transparent conductive materials, e.g., ITO, IZO, and ITZO, and may be substantially transparent or semi-transparent to satisfy a certain transmittancy (e.g., a predetermined transmittancy). In other words, the first and second contact electrodes CNT1 and CNT2 may be formed of transparent conductive material such that light emitted from each first light emitting element LD1 may be transmitted without a loss.

However, the material of the first and second contact electrodes CNT1 and CNT2 is not limited to the above-described embodiments. According to an embodiment, the first and second contact electrodes CNT1 and CNT2 may be formed of any of various opaque conductive materials.

In various embodiments of the present disclosure, the above-described first and second banks BNK1 and BNK2, the first and second electrodes EL1 and EL2, the first light emitting element LD1, and the first and second contact electrodes CNT1 and CNT2 may be provided on each of the pixels PXL.

As illustrated in FIGS. 4 and 5, the first dummy electrode DEL1 and the second dummy electrodes DEL2 may be provided on the dummy area DA. The first dummy electrode DEL1 may extend in the first direction DR1, and may be spaced apart from the first and second electrodes EU and EL2 in the second direction DR2. The second dummy electrodes DEL2 may be spaced apart from each other in the first direction DR1, and may be spaced apart from the first and second electrodes EL1 and EL2 and the first dummy electrode DEL1 in the second direction DR2.

In various embodiments of the present disclosure, the second light emitting element LD2 may be provided between each of the second dummy electrodes DEL2 and the first dummy electrode DEL1. That is, one second light emitting element LD2 may be provided between each of the second dummy electrodes DEL2 and the first dummy electrode DEL1. Referring to FIG. 4, one of the second light emitting elements LD2 may be provided between the first dummy electrode DEL1 and a 2-1th dummy electrode DEL2-1, and one of the second light emitting elements LD2 may be provided between the first dummy electrode DEL1 and a 2-2th dummy electrode DEL2-2.

One second light emitting element LD2 is provided between each of the second dummy electrodes DEL2 and the first dummy electrode DEL1, such that the contact resistance of each of the second light emitting elements LD2 may be easily measured, as described later.

In various embodiments of the present disclosure, the first dummy electrode DEL1 may have a planar shape corresponding to a planar shape of the first electrode EL1, and each of the second dummy electrodes DEL2 may have a planar shape corresponding to a planar shape of the second electrode EL2.

In embodiments of the present disclosure, the corresponding shape may have a substantially equal or similar shape.

As will be described later, the first dummy electrode DEL1 and the second dummy electrodes DEL2 may be provided to measure the contact resistance of each second light emitting element LD2. In other words, the second light emitting element LD2 electrically coupled to the first dummy electrode DEL1 and the second dummy electrodes DEL2 may be a light emitting element that does not display an image in the display device.

The shape of the first dummy electrode DEL1 may correspond to the shape of the first electrode EL1, and the shape of the second dummy electrodes DEL2 may correspond to the shape of the second electrode EL2, such that the first light emitting element LD1 provided on the display area AA and the second light emitting element LD2 provided on the dummy area DA may be placed in a similar environment. Therefore, by measuring the contact resistance of the second light emitting element LD2 provided on the dummy area DA, it is possible to monitor an electrical environment such as the contact resistance of the first light emitting element LD1 provided on the display area AA without separately measuring the contact resistance of the first light emitting element LD1.

In an embodiment, the first dummy electrode DEL1 and the second dummy electrodes DEL2 may be formed of the same material as the first and second electrodes EL1 and EL2. Thus, the first light emitting element LD1 provided on the display area AA and the second light emitting element LD2 provided on the dummy area DA may be placed in a similar environment, and the contact resistance of the first light emitting element LD1 may be more precisely monitored by measuring the contact resistance of the second light emitting element LD2.

The insulating layer INS may be provided on a surface of the substrate SUB on which the first dummy electrode DEL1 and the second dummy electrodes DEL2 are provided, and the second light emitting element LD2 and the first and second dummy contact electrodes DCNT1 and DCNT2 may be provided on the insulating layer INS.

As illustrated in FIG. 5, through the contact hole formed through the insulating layer INS, the first dummy contact electrode DCNT1 may be coupled to the first dummy electrode DEL1, and the second dummy contact electrode DCNT2 may be coupled to each of the second dummy electrodes DEL2.

As illustrated in FIGS. 4 and 5, the first dummy contact electrode DCNT1 may cover at least a portion of the first dummy electrode DEL1, and the first dummy electrode DEL1 may be electrically coupled to the second light emitting element LD2. Further, the second dummy contact electrode DCNT2 may cover at least a portion of the second dummy electrodes DEL2, and the second dummy electrodes DEL2 may be electrically coupled to the second light emitting element LD2.

In an embodiment, unlike in FIG. 5, the insulating layer INS may include a third opening (not illustrated) that exposes a portion of the first dummy electrode DEL1, and a fourth opening (not illustrated) that exposes a portion of each of the second dummy electrodes DEL2. Here, the first dummy contact electrode DCNT1 may be provided in the third opening, such that it may come into contact with the first dummy electrode DEL1 exposed through the third opening. Further, the second dummy contact electrode DCNT2 may be provided in the fourth opening, such that it may come into contact with each of the second dummy electrodes DEL2 exposed through the fourth opening.

The first dummy contact electrode DCNT1 may be provided on one end of the second light emitting element LD2, and the second dummy contact electrode DCNT2 may be provided on the other end thereof. Thereby, the second light emitting element LD2 may be electrically coupled to the first dummy electrode DEL1 and the second dummy electrodes DEL2.

Each of the first and second dummy contact electrodes DCNT1 and DCNT2 may be formed of a same material as the above-described first and second contact electrodes CNT1 and CNT2. Thus, the first light emitting element LD1 provided on the display area AA and the second light emitting element LD2 provided on the dummy area DA may be placed in a similar environment, and the contact resistance of the first light emitting element LD1 may be more precisely monitored by measuring the contact resistance of the second light emitting element LD2.

In various embodiments of the present disclosure, the display element layer DPL may include an encapsulation layer INC on a surface of the substrate SUB on which the first and second banks BNK1 and BNK2, the first and second electrodes EL1 and EL2, the first light emitting element LD1, the first and second contact electrodes CNT1 and CNT2, the bank pattern BNKP, the first dummy electrode DEL1, the second dummy electrodes DEL2, the second light emitting element LD2, and the first and second dummy contact electrodes DCNT1 and DCNT2 are provided.

The encapsulation layer INC may cover the first and second electrodes EL1 and EL2, the first and second contact electrodes CNT1 and CNT2, the first light emitting element LD1, the first and second dummy electrodes DEL1 and DEL2, the first and second dummy contact electrodes DCNT1 and DCNT2, and the second light emitting element LD2 to prevent or substantially prevent them from being exposed to the outside, thus preventing or substantially preventing them from being corroded.

The encapsulation layer INC may be configured of a single layer or multiple layers, and may include a transparent insulating material and thus allow light to pass therethrough. The transparent insulating material may include an organic material or an inorganic material. For example, the encapsulation layer INC may include a transparent insulating material such as silicon nitride (SiNx), silicon oxide (SiOx), or silicon oxynitride (SiOxNy).

In an embodiment, the encapsulation layer INC may be formed of a low refractive index transparent insulating material, such as silicon oxide (SiOx) so as to minimize or reduce a loss of light that is emitted from the first light emitting element LD1 and then is reflected in the image display direction of the display device by the first and second electrodes EL1 and EL2.

In an embodiment, the encapsulation layer INC may include a thin film encapsulation layer having a multi-layer structure. For example, the encapsulation layer INC may be configured of a thin film encapsulation layer of a multi-layer structure including inorganic insulating layers of at least two layers and an organic insulating layer of at least one layer interposed between the inorganic insulating layers of at least two layers. However, the configuration, material and/or the structure of the encapsulation layer INC may be variously changed.

In various embodiments of the present disclosure, an overcoat layer (not illustrated) may be provided on the encapsulation layer INC. The overcoat layer may be an encapsulating layer to prevent or substantially prevent oxygen, water, and the like from penetrating into the first and second light emitting elements LD1 and LD2.

Figure 6:
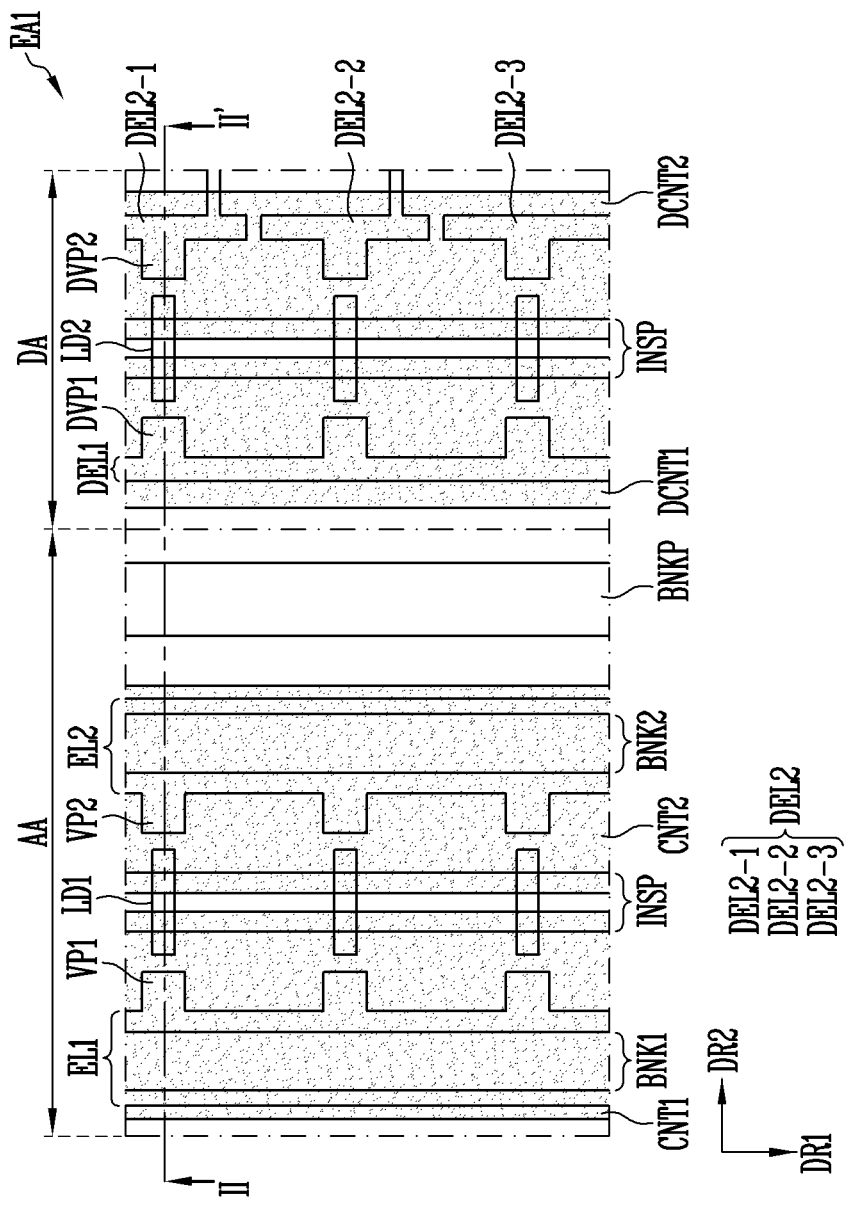
FIG. 6 is a plan view schematically illustrating another embodiment of a display element layer in which a region "EA1" of FIG. 3 is enlarged.
Figure 7:
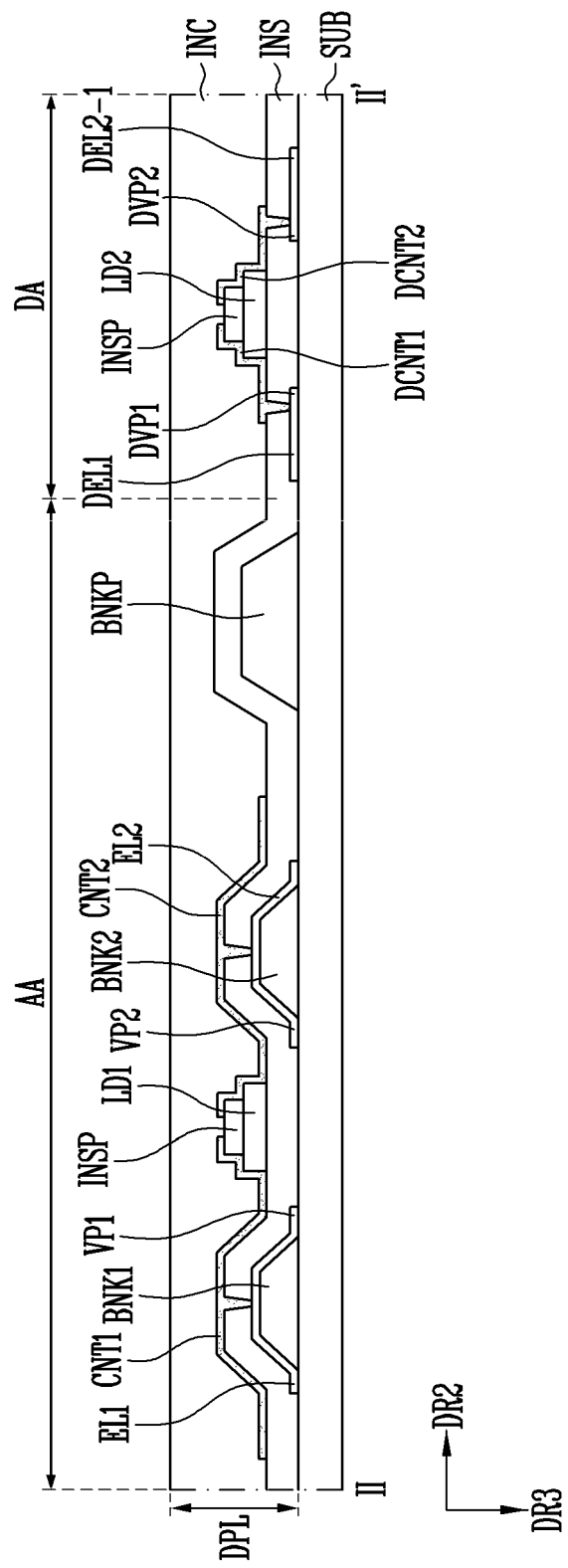
FIG. 7 is a cross-sectional view taken along the line II-II' of FIG. 6.

FIG. 6 is a plan view schematically illustrating another embodiment of a display element layer in which a region "EA1" of FIG. 3 is enlarged; and FIG. 7 is a cross-sectional view taken along the line II-II' of FIG. 6.

In order to avoid a duplicated description, a configuration that is not mentioned in the display device according to the above-described embodiment will be mainly described. Components which are not separately explained in the following description of the present embodiment may be the same or similar to those of the foregoing embodiments. The same reference numeral will be used to designate the same component, and a similar reference numeral will be used to designate a similar component. The same applies to the following embodiment.

Referring to FIGS. 6 and 7, the display element layer DPL in accordance with an embodiment of the present disclosure may include first and second banks BNK1 and BNK2 provided on the substrate SUB, first and second electrodes EU and EL2, a first light emitting element LD1, first and second contact electrodes CNT1 and CNT2, a bank pattern BNKP, a first dummy electrode DEL1, second dummy electrodes DEL2, a second light emitting element LD2, first and second dummy contact electrodes DCNT1 and DCNT2, and an insulating pattern INSP.

In various embodiments of the present disclosure, the first electrode EL1 may include a first protrusion VP1 that protrudes towards the second electrode EL2, and the second electrode EL2 may include a second protrusion VP2 that protrudes towards the first electrode EL1. Here, the first protrusion VP1 and the second protrusion VP2 may face each other.

As illustrated in FIG. 6, as the first protrusion VP1 and the second protrusion VP2 face each other, when an alignment signal that will be described later is applied to the first and second electrode EL1 and EL2, an electric field may concentrate between the first protrusion VP1 and the second protrusion VP2, and, thus, the first light emitting element LD1 may be effectively aligned between the first protrusion VP1 and the second protrusion VP2. Thus, the first light emitting element LD1 may be provided between the first protrusion VP1 and the second protrusion VP2.

In an embodiment, although not illustrated in FIG. 6, the first bank BNK1 may include a first bank protrusion (not illustrated) that protrudes towards the second bank BNK2, and the second bank BNK2 may include a second bank protrusion (not illustrated) that protrudes towards the first bank BNK1.

Here, on a plane, the shape of the first electrode EL1 may correspond to the shape of the first bank BNK1, and the shape of the second electrode EL2 may correspond to the shape of the second bank BNK2. In other words, the first electrode EL1 may be provided on the first bank BNK1 such that the first protrusion VP1 overlaps in the shape corresponding to the planar shape of the first bank protrusion, and the second electrode EL2 may be provided on the second bank BNK2 such that the second protrusion VP2 overlaps in the shape corresponding to the planar shape of the second bank protrusion.

As illustrated in FIGS. 6 and 7, the display element layer DPL may include the insulating pattern INSP provided on the first and second light emitting elements LD1 and LD2. The insulating pattern INSP may prevent or substantially prevent the first light emitting element LD1 provided between the first and second electrodes EL1 and EL2 and the second light emitting element LD2 provided between the first and second dummy electrodes DEL1 and DEL2 from deviating from an aligned position.

The insulating pattern INSP may be provided to extend in the first direction DR1. The insulating pattern INSP may overlap a portion of the light emitting elements LD to expose one end and the other end of the light emitting elements LD. The insulating pattern INSP may be formed of a transparent insulating material to allow light emitted from the light emitting elements LD to be transmitted without a loss.

The insulating pattern INSP may be formed of a single layer or a multilayer structure, and may include an inorganic insulating layer including at least one inorganic material or an organic insulating layer including at least one organic material. The insulating pattern INSP may further fix each of the first light emitting elements LD1 arranged in the emission area of each pixel PXL.

In an embodiment of the present disclosure, the insulating pattern INSP may include an inorganic insulating layer to protect the active layer 12 of each of the light emitting elements LD from external oxygen or water. However, the present disclosure is not limited thereto. In an embodiment, the insulating pattern INSP may include an organic insulating layer containing an organic material depending on design conditions of the display device to which the light emitting elements LD are applied.

In an embodiment, although not illustrated in the drawings, an empty gap (or space) may be present between the insulating layer INS and the light emitting elements LD in the third direction DR3 before forming the insulation pattern INSP, and the empty gap may be filled with the insulating pattern INSP in the process of forming the insulating pattern INSP. Thus, the insulating pattern INSP may form an organic insulating layer to fill the empty gap between the insulating layer INS and the light emitting elements LD.

The first contact electrode CNT1 may be provided on one end of the first light emitting element LD1 exposed by the insulating pattern INSP, and the second contact electrode CNT2 may be provided on the other end thereof. Thereby, the first light emitting element LD1 may be electrically coupled to the first and second electrodes EL1 and EL2.

Further, the first and second contact electrodes CNT1 and CNT2 may also be provided on the insulating pattern INSP. Here, the first contact electrode CNT1 and the second contact electrode CNT2 may be spaced apart from each other on the insulating pattern INSP. As the first and second contact electrodes CNT1 and CNT2 are provided on the insulating pattern INSP, the position of the first light emitting element LD1 aligned between the first and second electrodes EL1 and EL2 may be more stably fixed.

In various embodiments of the present disclosure, the first dummy electrode DEL1 may include a first dummy protrusion DVP1 protruding towards each of the second dummy electrodes DEL2, and each of the second dummy electrodes DEL2 may include a second dummy protrusion DVP2 protruding towards the first dummy electrode DEL1. As illustrated in FIG. 6, the first dummy electrode DEL1 may include first dummy protrusions DVP1 protruding towards 2-1th to 2-3th dummy electrodes DEL2-1, DEL2-2, and DEL2-3, respectively. Each of the 2-1th to 2-3th dummy electrodes DEL2-1, DEL2-2, and DEL2-3 may include a second dummy protrusion DVP2 protruding towards the first dummy electrode DEL1.

As illustrated in FIG. 6, as the first dummy protrusion DVP1 and the second dummy protrusion DVP2 face each other, when an alignment signal that will be described later is applied to the first dummy electrode DEL1 and the second dummy electrodes DEL2, an electric field may concentrate between the first dummy protrusion DVP1 and the second dummy protrusion DVP2, and, thus, the second light emitting element LD2 may be effectively aligned between the first dummy protrusion DVP1 and the second dummy protrusion DVP2. Thus, the second light emitting element LD2 may be provided between the first dummy protrusion DVP1 and the second dummy protrusion DVP2. That is, one second light emitting element LD2 may be provided between the first dummy protrusion DVP1 and the second dummy protrusion DVP2.

In an embodiment of the present disclosure, the first dummy protrusion DVP1 may have a planar shape corresponding to a planar shape of the first protrusion VP1, and the second dummy protrusion DVP2 may have a planar shape corresponding to a planar shape of the second protrusion VP2.

The planar shape of the first dummy protrusion DVP1 may correspond to the planar shape of the first protrusion VP1, and the planar shape of the second dummy protrusion DVP2 may correspond to the planar shape of the second protrusion VP2, such that the first light emitting element LD1 provided on the display area AA and the second light emitting element LD2 provided on the dummy area DA may be placed in a more similar environment. Therefore, it is possible to make a qualitative analysis of the electrical environment such as the contact resistance of the first light emitting element LD1 provided on the display area AA, by measuring the contact resistance of the second light emitting element LD2 provided on the dummy area DA.

The first dummy contact electrode DCNT1 may be provided on one end of the second light emitting element LD2 exposed by the insulating pattern INSP, and the second dummy contact electrode DCNT2 may be provided on the other end thereof. Thereby, the second light emitting element LD2 may be electrically coupled to the first and second dummy electrodes DEL1 and DEL2.

Figure 8:
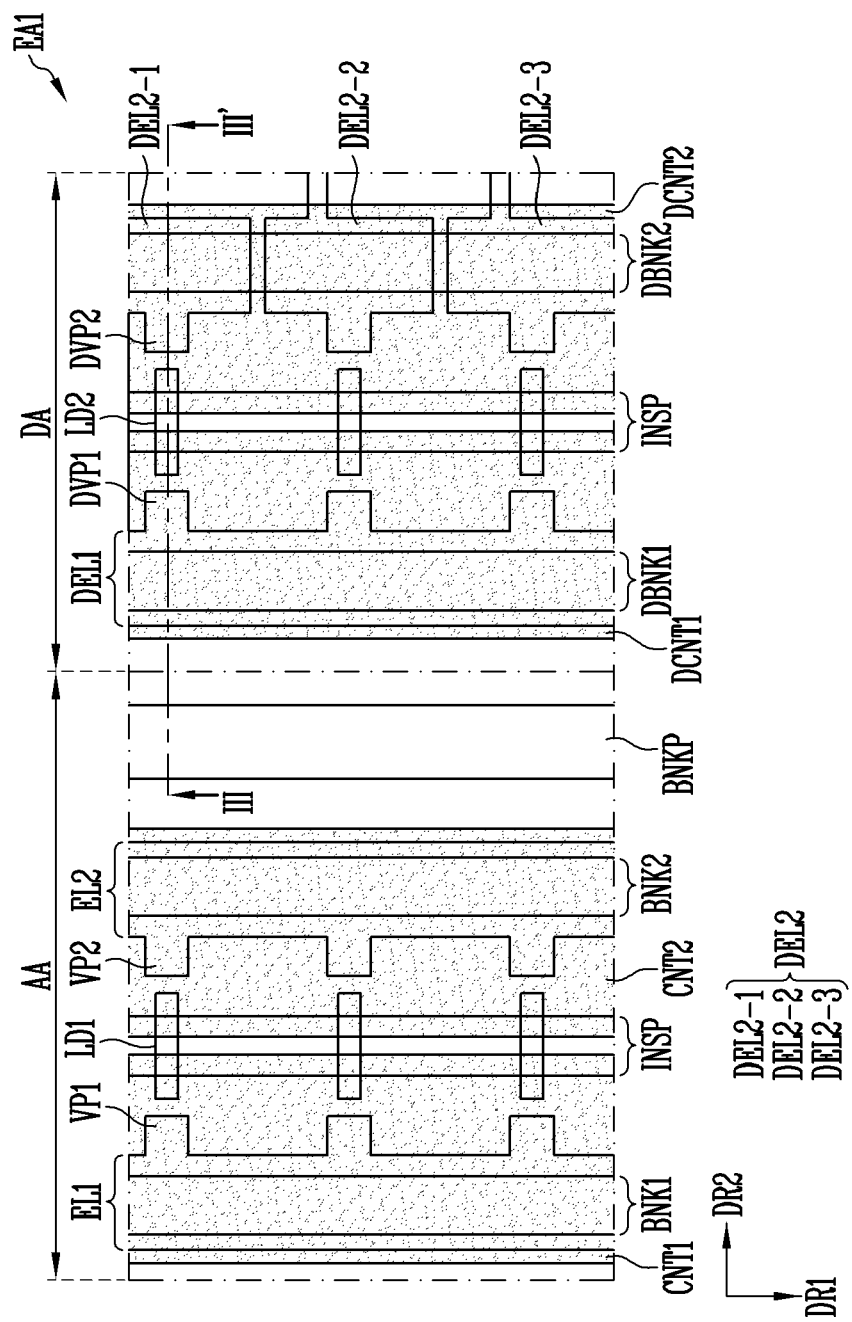
FIG. 8 is a plan view schematically illustrating another embodiment of a display element layer in which a region "EA1" of FIG. 3 is enlarged.
Figure 9:
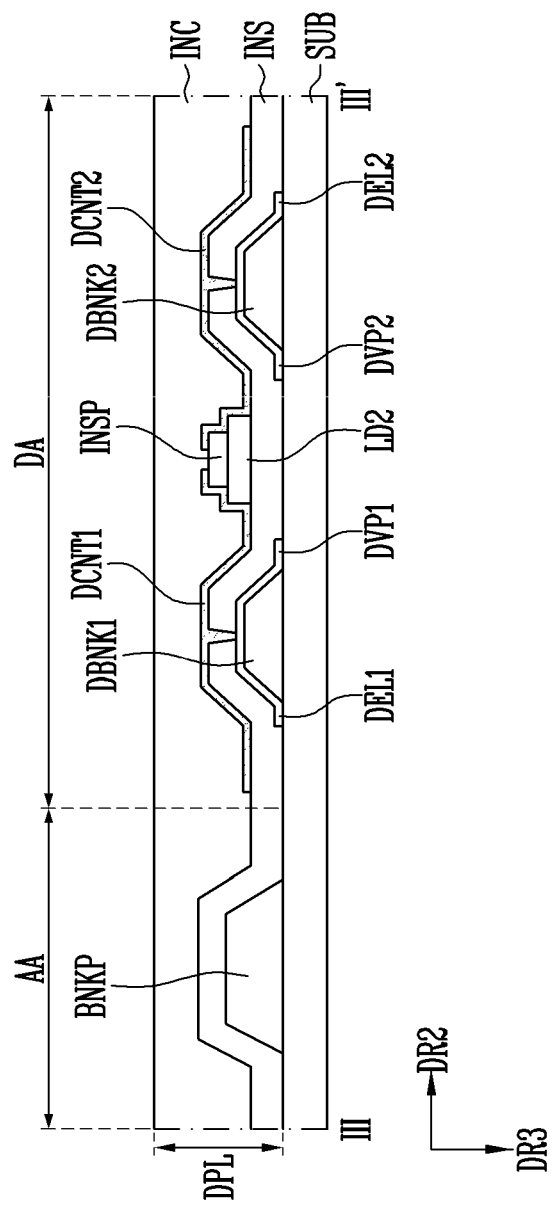
FIG. 9 is a cross-sectional view taken along the line III-III' of FIG. 8.

FIG. 8 is a plan view schematically illustrating another embodiment of a display element layer in which a region "EA1" of FIG. 3 is enlarged; and FIG. 9 is a cross-sectional view taken along the line III-III' of FIG. 8.

Referring to FIGS. 8 and 9, the display element layer DPL in accordance with an embodiment of the present disclosure may include first and second banks BNK1 and BNK2 provided on the substrate SUB, first and second electrodes EU and EL2, a first light emitting element LD1, first and second contact electrodes CNT1 and CNT2, a bank pattern BNKP, first and second dummy banks DBNK1 and DBNK2, a first dummy electrode DEL1, second dummy electrodes DEL2, a second light emitting element LD2, first and second dummy contact electrodes DCNT1 and DCNT2, and an insulating pattern INSP.

As illustrated in FIG. 8, the first and second dummy banks DBNK1 and DBNK2 may extend in the first direction DR1, and may be provided on the dummy area DA to be spaced apart from each other in the second direction DR2.

First and second dummy banks DBNK1 and DBNK2 that are adjacent to each other may be provided on the dummy area DA to be spaced apart from each other by a certain distance (e.g., a predetermined distance) in the second direction DR2. For example, the first and second dummy banks DBNK1 and DBNK2 adjacent to each other may be provided on the dummy area DA to be spaced apart from each other by a length of the second light emitting element LD2.

The first and second dummy banks DBNK1 and DBNK2 may include an inorganic insulating layer made of an inorganic material or an organic insulating layer made of an organic material. According to an embodiment, the first and second dummy banks DBNK1 and DBNK2 may include a single organic insulating layer and/or a single inorganic insulating layer, but the present disclosure is not limited thereto. According to an embodiment, the first and second dummy banks DBNK1 and DBNK2 may be provided in the form of a multilayer structure by stacking at least one organic insulating layer and at least one inorganic insulating layer. However, the material of the first and second dummy banks DBNK1 and DBNK2 is not limited to the above-described embodiments. According to an embodiment, the first and second dummy banks DBNK1 and DBNK2 may include a conductive material.

As illustrated in FIG. 8, the first and second dummy banks DBNK1 and DBNK2 each may have a cross-section of a trapezoid which is reduced in width from the bottom to the top in a third direction DR3, but is not limited thereto. In another embodiment, the first and second dummy banks DBNK1 and DBNK2 each may have a curved surface having a semi-circular or a semi-elliptical cross-section which is reduced in width from the bottom to the top.

The first dummy electrode DEL1 may be provided on the first dummy bank DBNK1, and each of the second dummy electrodes DEL2 may be provided on the second dummy bank DBNK2. The first dummy electrode DEL1 and the second dummy electrodes DEL2 each may be a reflective electrode. Each of the first and second dummy electrodes DEL1 and DEL2 that are the reflective electrode may guide light, emitted from the second light emitting element LD2, from the substrate SUB towards the display element layer DPL (e.g., a front surface). In other words, the first and second dummy banks DBNK1 and DBNK2 and the first and second dummy electrodes DEL1 and DEL2 each may function as a reflective member that guides light emitted from the second light emitting element LD2 in a desired direction.

The shape of the first and second dummy banks DBNK1 and DBNK2 may correspond to the shape of the first and second banks BNK1 and BNK2. Thus, the light outputted from the second light emitting element LD2 may have a light output efficiency and a light output direction that are similar to those of the light outputted from the first light emitting element LD1. Therefore, it is possible to monitor the optical environment of the light outputted from the first light emitting element LD1 on the display area AA, by observing the light output efficiency and the light output direction of the second light emitting element LD2 provided on the dummy area DA.

In an embodiment, although not illustrated in FIG. 8, the first dummy bank DBNK1 may include a first dummy bank protrusion (not illustrated) that protrudes towards the second dummy bank DBNK2, and the second dummy bank DBNK2 may include a second dummy bank protrusion (not illustrated) that protrudes towards the first dummy bank DBNK1.

Here, on a plane, the shape of the first dummy electrode DEL1 may correspond to the shape of the first dummy bank DBNK1, and the shape of the second dummy electrode DEL2 may correspond to the shape of the second dummy bank DBNK2. In other words, the first dummy electrode DEL1 may be provided on the first dummy bank DBNK1 such that the first dummy protrusion DVP1 overlaps in the shape corresponding to the planar shape of the first dummy bank protrusion. Further, the second dummy electrodes DEL2 each may be provided on the second dummy bank DBNK2 such that the second dummy protrusion DVP2 overlaps in the shape corresponding to the planar shape of the second dummy bank protrusion.

Figure 10:
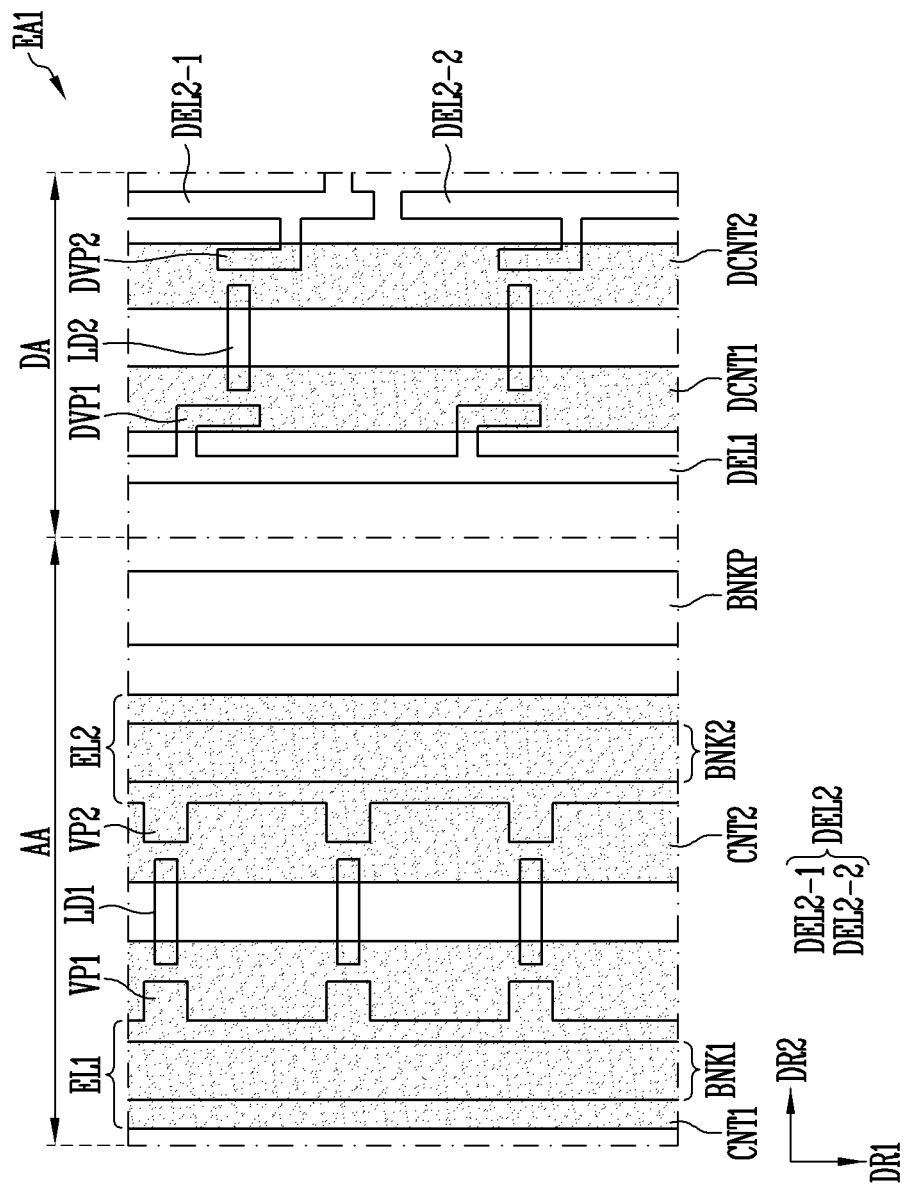
FIG. 10 is a plan view schematically illustrating another embodiment of a display element layer in which a region "EA1" of FIG. 3 is enlarged.

FIG. 10 is a plan view schematically illustrating a further embodiment of a display element layer in which a region "EA1" of FIG. 3 is enlarged.

Referring to FIG. 10, the display element layer DPL in accordance with an embodiment of the present disclosure may include first and second banks BNK1 and BNK2 provided on the substrate SUB, first and second electrodes EL1 and EL2, a first light emitting element LD1, first and second contact electrodes CNT1 and CNT2, a bank pattern BNKP, a first dummy electrode DEL1, second dummy electrodes DEL2, a second light emitting element LD2, and first and second dummy contact electrodes DCNT1 and DCNT2.

In an embodiment, although not illustrated in FIG. 10, the display element layer DPL may further include an insulating pattern INSP and first and second dummy banks DBNK1 and DBNK2.

In an embodiment of the present disclosure, the first dummy protrusion DVP1 may have a shape different from a planar shape of the first protrusion VP1, and the second dummy protrusion DVP2 may have a shape different from a planar shape of the second protrusion VP2.

As illustrated in FIG. 10, the planar shape of the first dummy protrusion DVP1 may be different from the planar shape of the first protrusion VP1, and the planar shape of the second dummy protrusion DVP2 may be different from the planar shape of the second protrusion VP2. That is, the first and second dummy electrodes DEL1 and DEL2 which are different in shape from the first and second electrodes EL1 and EL2 may be provided on the dummy area DA.

Since the first and second dummy electrodes DEL1 and DEL2 are different in shape from the first and second electrodes EL1 and EL2, the contact resistance of the second light emitting element LD2 according to various shapes of the first and second dummy electrodes DEL1 and DEL2 on the dummy area DA may be measured. Further, according to various shapes of the first and second dummy electrodes DEL1 and DEL2, an alignment degree and a shape of the second light emitting element LD2 aligned between the first and second dummy electrodes DEL1 and DEL2 may be observed.

Thereby, it is possible to obtain the shape of the first and second dummy electrodes DEL1 and DEL2 which are minimized or reduced in contact resistance and excellent in the alignment degree of the second light emitting element LD2. Based on the shape, the shape of the first and second electrodes EU and EL2 provided on the display area AA may be designed.

Therefore, according to an embodiment of the present disclosure, the shape of the first and second dummy electrodes DEL1 and DEL2 provided on the dummy area DA may be variously provided, and the contact resistance and the alignment degree of the second light emitting element LD2 electrically coupled to the first and second dummy electrodes DEL1 and DEL2 may be measured, such that the shape of the first and second electrodes EL1 and EL2 provided on the display area AA of the display device that is subsequently fabricated may be designed.

FIGS. 11 to 14 are plan views schematically illustrating various embodiments of the display element layer in which a region "EA2" of FIG. 3 is enlarged.

Referring to FIGS. 11 to 14, the display element layer DPL according to an embodiment of the present disclosure may include a first dummy electrode DEL1, second dummy electrodes DEL2, a second light emitting element LD2, and first and second dummy contact electrodes DCNT1 and DCNT2, which are provided on the dummy area DA. In an embodiment, although not illustrated in FIGS. 11 to 14, the display element layer DPL may further include an insulating pattern INSP and first and second dummy banks DBNK1 and DBNK2, which are provided on the dummy area DA.

As illustrated in FIGS. 11 to 14, the dummy area DA may include sub dummy areas SDA1 and SDA2 that are spaced apart from each other in the first direction DR1. Here, the second light emitting element LD2 may be provided on each of the sub dummy areas SDA1 and SDA2. That is, a second light emitting element LD2 may be provided on each of the sub dummy areas SDA1 and SDA2.

The first dummy electrode DEL1 may extend in the first direction DR1 and may overlap each of the sub dummy areas SDA1 and SDA2. A second dummy electrode DEL2 may be provided on each of the sub dummy areas SDA1 and SDA2. Thus, a second light emitting element LD2 may be provided on each of the sub dummy areas SDA1 and SDA2. As will be described later, the contact resistance of the second light emitting element LD2 provided on the sub dummy areas SDA1 and SDA2 may be measured.

In various embodiments of the present disclosure, the shape of the first and second dummy protrusions DVP1 and DVP2 provided in at least one of the sub dummy areas SDA1 and SDA2 may be different from the shape of the first and second dummy protrusions DVP1 and DVP2 provided in a remaining area of the sub dummy areas SDA1 and SDA2.

Figure 11:
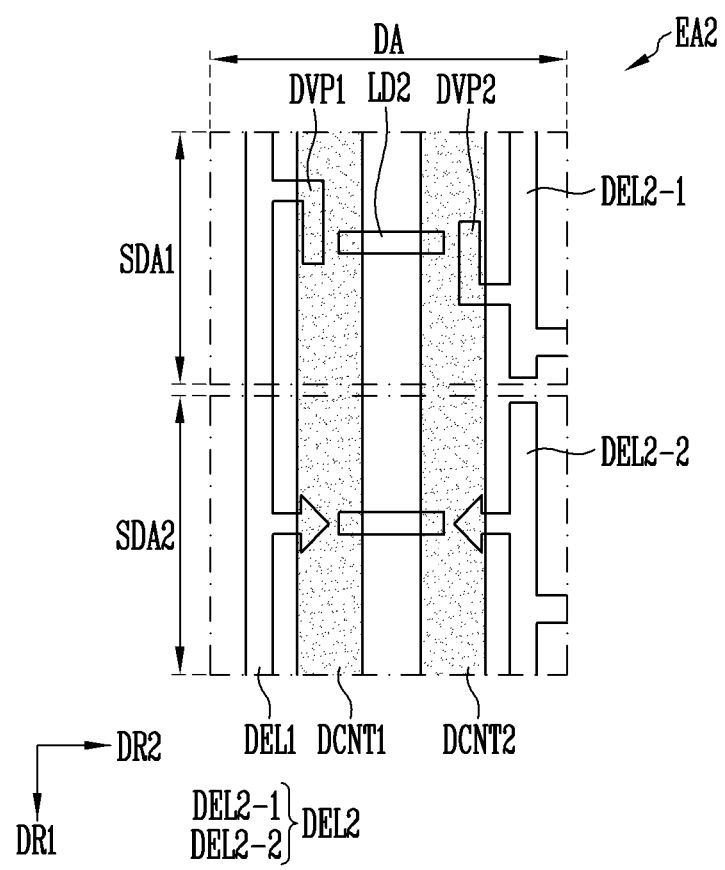
FIGS. 11 to 14 are plan views schematically illustrating various embodiments of a display element layer in which a region "EA2" of FIG. 3 is enlarged.

As illustrated in FIG. 11, the first dummy protrusion DVP1 located in the first sub dummy area SDA1 may be different in shape from the first dummy protrusion DVP1 located in the second sub dummy area SDA2. Further, the second dummy protrusion DVP2 located in the first sub dummy area SDA1 may be different in shape from the second dummy protrusion DVP2 located in the second sub dummy area SDA2.

In an embodiment, since the first and second dummy protrusions DVP1 and DVP2 provided in the sub dummy areas SDA1 and SDA2 have different shapes, the alignment degree and shape of the second light emitting element LD2 depending on the shape of the first and second dummy protrusions DVP1 and DVP2 may be observed, and the contact resistance of the second light emitting element LD2 may be measured.

In order to improve the reliability of a measured value, for example, a plurality of first sub dummy areas SDA1 shown in FIG. 11 may be provided in the dummy area DA, and a plurality of second sub dummy areas SDA2 may be provided in the dummy area DA.

In various embodiments of the present disclosure, a distance d1 between the first dummy protrusion DVP1 and the second dummy protrusion DVP2 provided in at least one of the sub dummy areas SDA1 and SDA2 to be spaced apart from each other in the second direction DR2 may be different from a distance d2 between the first dummy protrusion DVP1 and the second dummy protrusion DVP2 provided in a remaining area of the sub dummy areas SDA1 and SDA2 to be spaced apart from each other in the second direction DR2.

Figure 12:
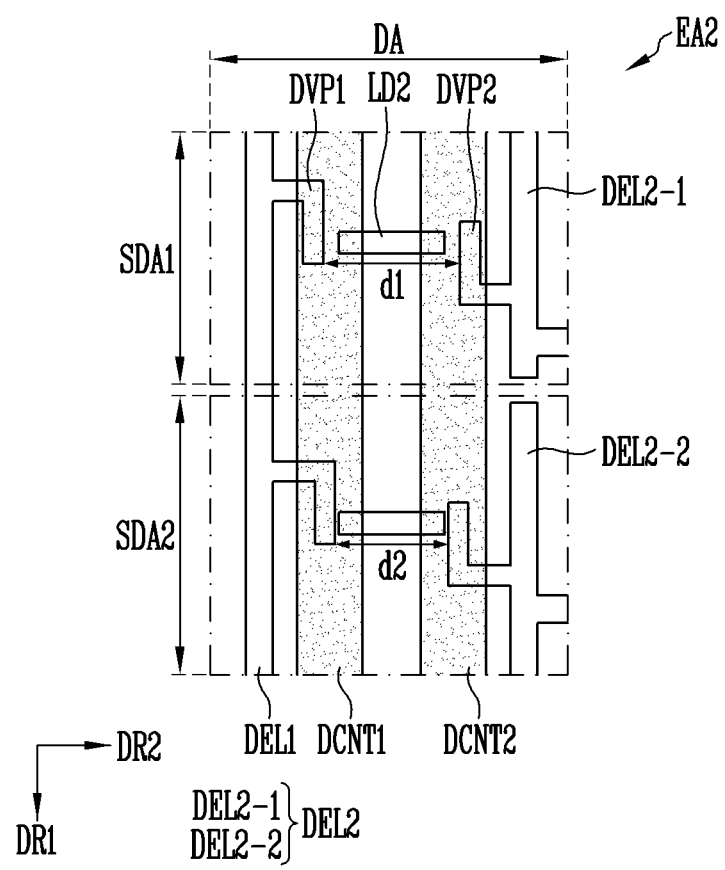

As illustrated in FIG. 12, the distance d1 between the first dummy protrusion DVP1 and the second dummy protrusion DVP2 provided in the first sub dummy area SDA1 to be spaced apart from each other may be different from the distance d2 between the first dummy protrusion DVP1 and the second dummy protrusion DVP2 provided in the second sub dummy area SDA2 to be spaced apart from each other.

Since distances between the first and second dummy protrusions DVP1 and DVP2 provided in the sub dummy areas SDA1 and SDA2 are different from each other, the alignment degree and shape of the second light emitting element LD2 depending on the distance between the first and second dummy protrusions DVP1 and DVP2 may be observed, and the contact resistance of the second light emitting element LD2 may be measured.

In various embodiments of the present disclosure, a width a1 of a portion where the first dummy protrusion DVP1 provided in at least one of the sub dummy areas SDA1 and SDA2 faces the second dummy protrusion DVP2 on a plane may be different from a width a2 of a portion where the first dummy protrusion DVP1 provided in a remaining area of the sub dummy areas SDA1 and SDA2 faces the second dummy protrusion DVP2 on a plane.

Figure 13:
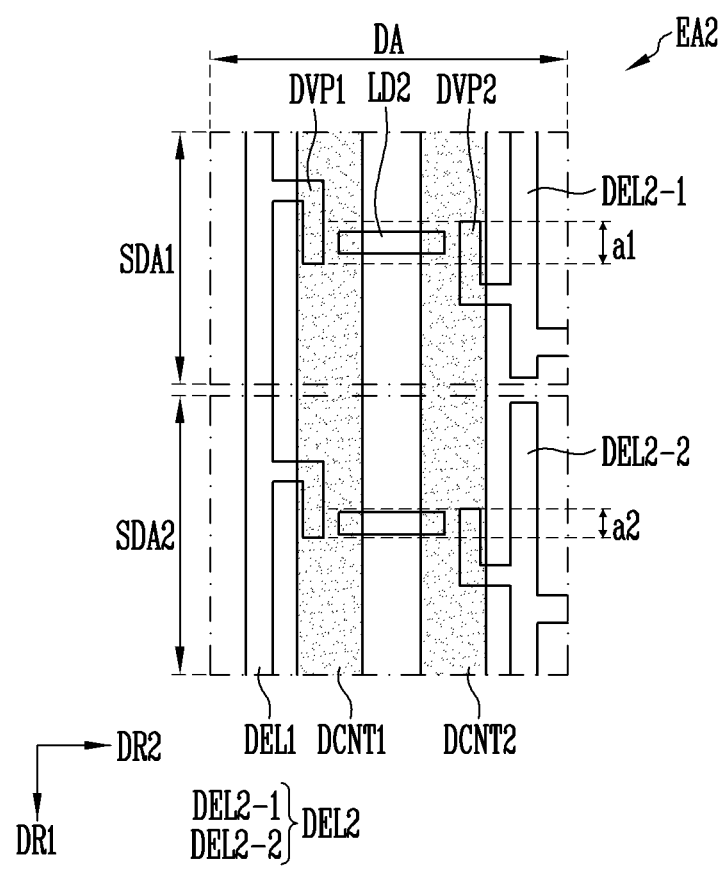

As illustrated in FIG. 13, the width a1 of a portion where the first dummy protrusion DVP1 provided in the first sub dummy area SDA1 faces the second dummy protrusion DVP2 on a plane may be different from the width a2 of a portion where the first dummy protrusion DVP1 provided in the second sub dummy area SDA2 faces the second dummy protrusion DVP2 on a plane.

In an embodiment, since overlapping widths between the first and second dummy protrusions DVP1 and DVP2 provided in the sub dummy areas SDA1 and SDA2 are different from each other, the alignment degree and shape of the second light emitting element LD2 depending on the overlapping width between the first and second dummy protrusions DVP1 and DVP2 may be observed, and the contact resistance of the second light emitting element LD2 may be measured.

Figure 14:
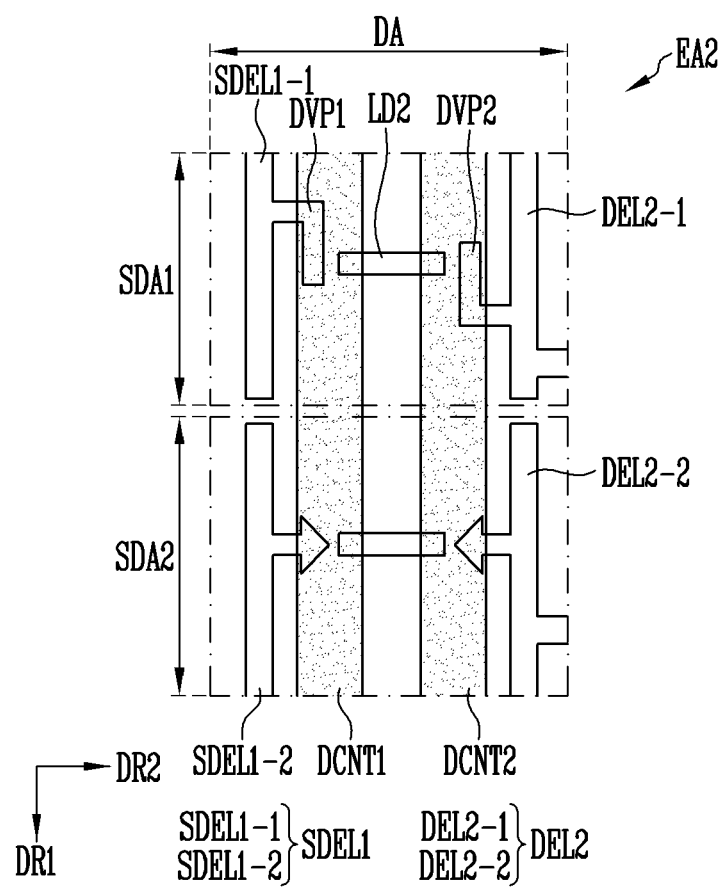

In various embodiments of the present disclosure, the first dummy electrode DEL1 may include first sub dummy electrodes SDEL1 that are spaced apart from each other in the first direction DR1. As illustrated in FIG. 14, a 1-1th sub dummy electrode SDEL1-1 and a 2-1th dummy electrode DEL2-1 may be provided in the first sub dummy area SDA1, and a 1-2th sub dummy electrode SDEL1-2 and a 2-2th dummy electrode DEL2-2 may be provided in the second sub dummy area SDA2. The second light emitting element LD2 may be provided between each of the first sub dummy electrodes SDEL1 and each of the second dummy electrodes DEL2. That is, a second light emitting element LD2 may be provided between each of the first sub dummy electrodes SDEL1 and each of the second dummy electrodes DEL2.

In an embodiment, since a first sub dummy electrode SDEL1 and a second dummy electrode DEL2 are provided in each of the sub dummy areas SDA1 and SDA2, the contact resistance of the second light emitting element LD2 provided in each of the sub dummy areas SDA1 and SDA2 may be more precisely measured.

Figure 15A:
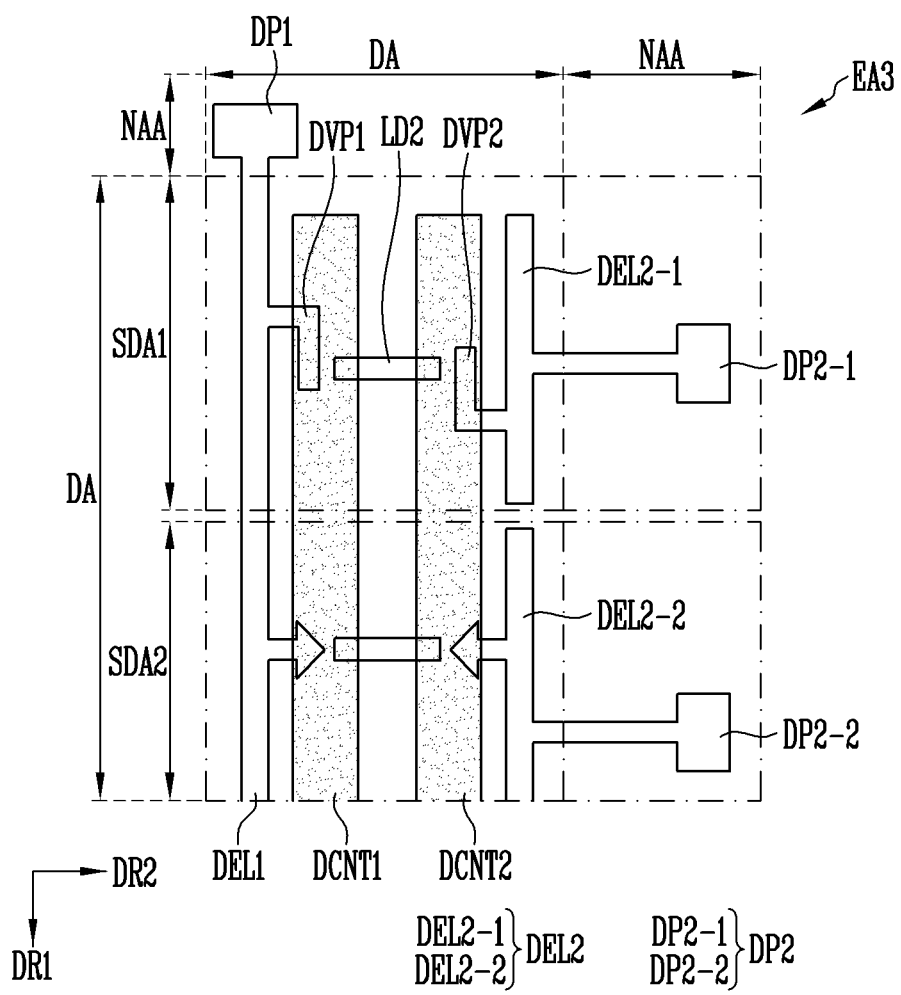
FIGS. 15A and 15B are plan views schematically illustrating various embodiments of a display element layer in which a region "EA3" of FIG. 3 is enlarged.
Figure 15B:
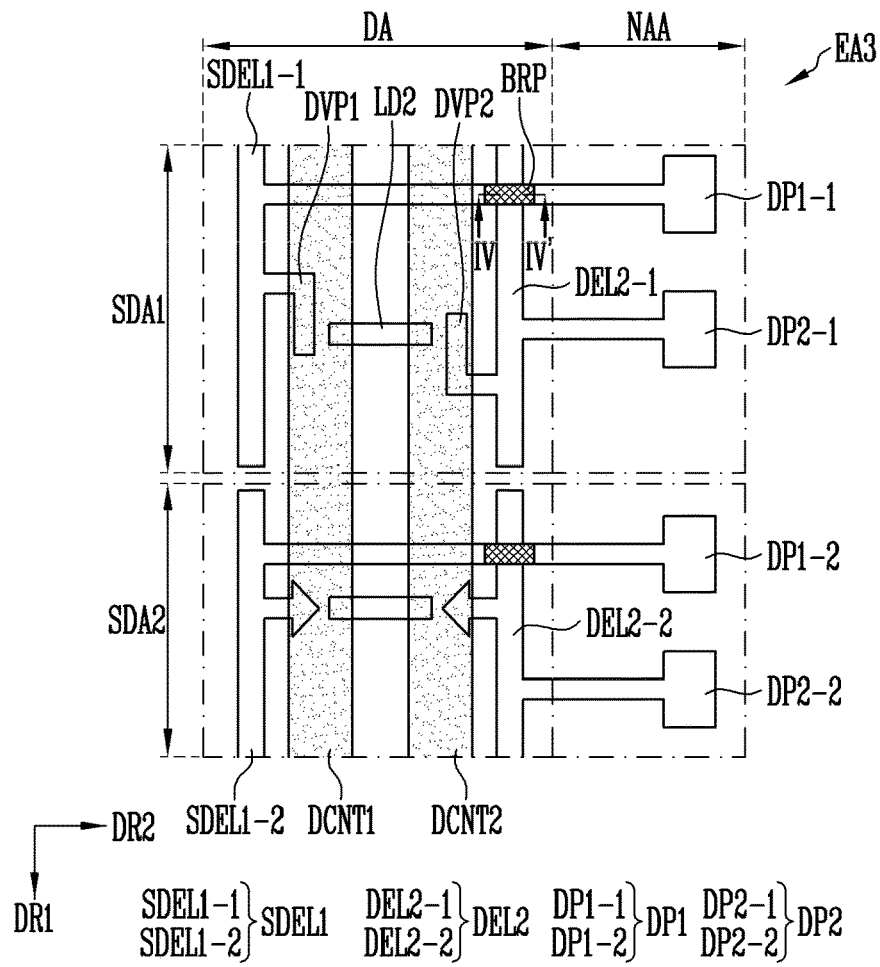
Figure 16:
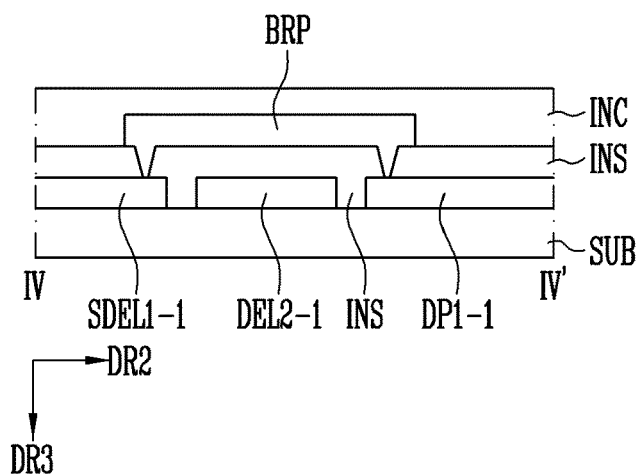
FIG. 16 is a cross-sectional view taken along the line IV-IV' of FIG. 15B.

FIGS. 15A and 15B are plan views schematically illustrating various embodiments of the display element layer in which a region "EA3" of FIG. 3 is enlarged; and FIG. 16 is a cross-sectional view taken along the line IV-IV' of FIG. 15B.

Referring to FIGS. 15A and 15B, the display element layer DPL according to an embodiment of the present disclosure may include a first dummy electrode DEL1, second dummy electrodes DEL2, a second light emitting element LD2, and first and second dummy contact electrodes DCNT1 and DCNT2, which are provided on the dummy area DA. Further, the display element layer DPL may include first and second dummy pads DP1 and DP2 provided on the non-display area NAA. In an embodiment, although not illustrated in FIGS. 15A and 15B, the display element layer DPL may further include an insulating pattern INSP and first and second dummy banks DBNK1 and DBNK2, which are provided on the dummy area DA.

In various embodiments of the present disclosure, the display element layer DPL may include a first dummy pad DP1 electrically coupled to the first dummy electrode DEL1, and second dummy pads DP2 coupled to the second dummy electrodes DEL2, respectively.

As illustrated in FIG. 15A, the first dummy electrode DEL1 may be coupled to the first dummy pad DP1 provided on the non-display area NAA. Each of the second dummy electrodes DEL2 may be coupled to respective second dummy pads DP2 provided on the non-display area NAA.

The first dummy electrode DEL1 may be electrically coupled to the first dummy contact electrode DCNT1, and the first dummy contact electrode DCNT1 may be electrically coupled to the second light emitting element LD2. Each of the second dummy electrodes DEL2 may be electrically coupled to the second dummy contact electrode DCNT2, and the second dummy contact electrode DCNT2 may be electrically coupled to the second light emitting element LD2.

A test signal may be applied to each of the first dummy pad DP1 and the second dummy pads DP2. Here, a first test signal applied to the first dummy pad DP1 and a second test signal applied to each of the second dummy pads DP2 may have different voltage levels. For example, the first test signal may have a higher voltage level than the second test signal. The first dummy pad DP1 may be coupled to the above-described first driving power supply (see VDD of FIGS. 2A and 2B), and each of the second dummy pads DP2 may be coupled to the above-described second driving power supply (see VSS of FIGS. 2A and 2B). Here, the first driving power supply VDD coupled to the first dummy pad DP1 and the second driving power supply VSS coupled to each of the second dummy pads DP2 may be provided outside the display device. That is, in an embodiment of the present disclosure, the contact resistance of the second light emitting element LD2 may be measured using the power supply that is provided outside the display device.

After the test signal is applied to each of the first dummy pad DP1 and the second dummy pads DP2, a signal outputted from each of the second light emitting elements LD2 may be measured, such that the contact resistance of each of the second light emitting elements LD2 may be calculated. For example, the contact resistance of each of the second light emitting elements LD2 may be calculated using a current value outputted from each of the second light emitting elements LD2.

Referring to FIG. 15B, the first dummy electrode DEL1 may include a plurality of first sub dummy electrodes SDEL1, and each of the plurality of first sub dummy electrodes SDEL1 may be coupled to respective first dummy pads DP1. That is, a 1-1th sub dummy electrode SDEL1-1 may be coupled to a 1-1th dummy pad DP1-1, and a 1-2th sub dummy electrode SDEL1-2 may be coupled to a 1-2th dummy pad DP1-2. Further, a 2-1th dummy electrode DEL2-1 may be coupled to a 2-1th dummy pad DP2-1, and a 2-2th dummy electrode DEL2-2 may be coupled to a 2-2th dummy pad DP2-2.

Thus, the contact resistance of the second light emitting element LD2 may be easily measured, by applying the test signal to each of the first and second dummy pads DP1 and DP2.

In an embodiment, as illustrated in FIG. 15B, a bridge pattern BRP may be provided on a portion where the first sub dummy electrode SDEL1 and the second dummy electrode DEL2 cross each other. Referring to FIG. 16, the bridge pattern BRP may be provided on the insulating layer INS, and the 1-1th dummy pad DP1-1 and the 1-1th sub dummy electrode SDEL1-1 may be electrically coupled via the contact hole formed through the insulating layer INS.

In various embodiments of the present disclosure, the first dummy pad DP1 and the second dummy pads DP2 may be provided on the non-display area NAA adjacent to the dummy area DA. By placing the first dummy pad DP1 and the second dummy pads DP2 adjacent to the dummy area DA where the first dummy electrode DEL1 and the second dummy electrodes DEL2 are provided, noise can be reduced when the contact resistance of the second light emitting element LD2 is measured. Thereby, the contact resistance of each second light emitting element LD2 may be more precisely measured.

Figure 17:
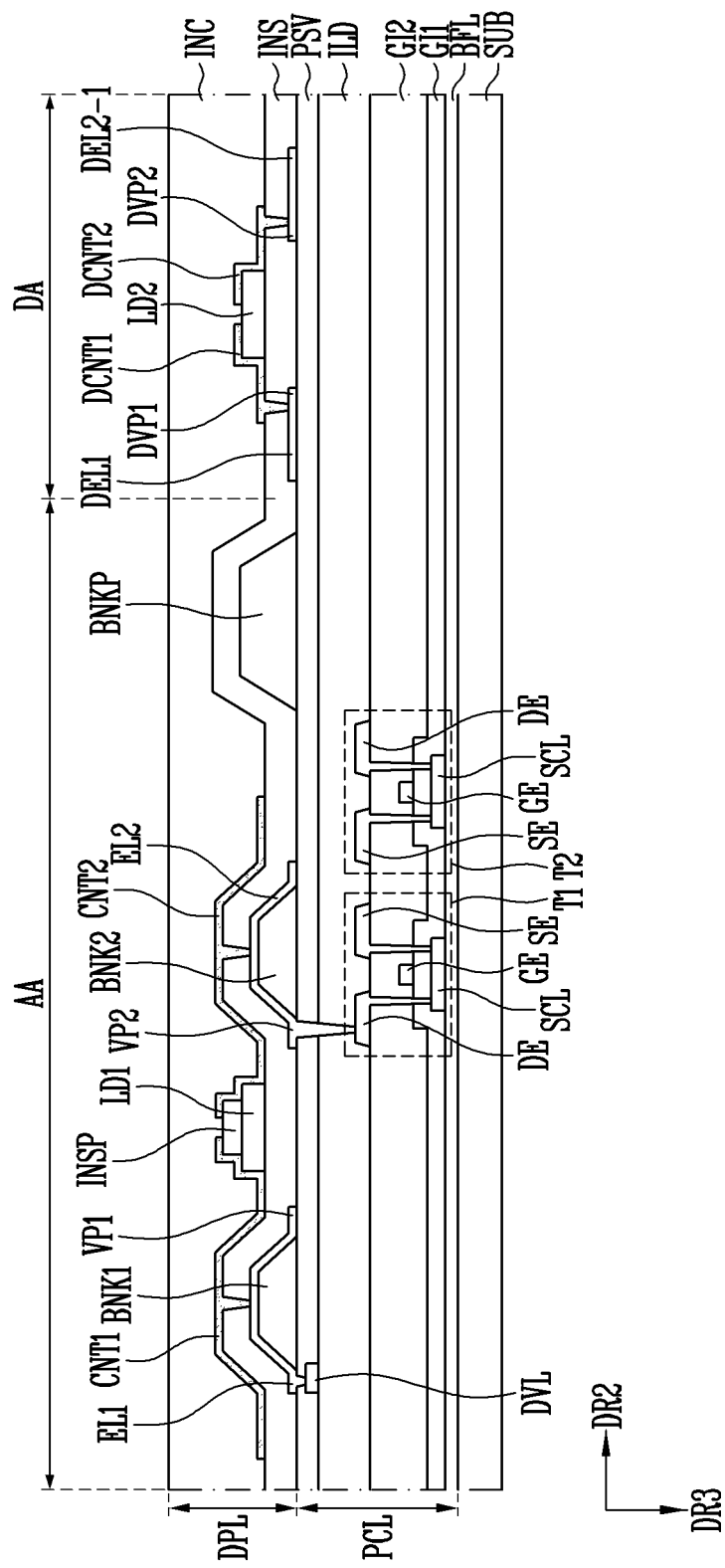
FIG. 17 is a cross-sectional view illustrating a display device in accordance with an embodiment of the present disclosure.

FIG. 17 is a cross-sectional view illustrating a display device in accordance with an embodiment of the present disclosure.

As illustrated in FIG. 17, a display device according to an embodiment may include a substrate SUB, a pixel circuit layer PCL, and a display element layer DPL.

The pixel circuit layer PCL may include a buffer layer BFL, a first transistor T1, a second transistor T2, and a driving voltage line DVL.

The buffer layer BFL may be provided on a surface of the substrate SUB. The buffer layer BFL may prevent or substantially prevent impurities from being diffused into each of the first and second transistors T1 and T2. The buffer layer BFL may be provided in a single layer structure or a multilayer structure having at least two or more layers. In a case in which the buffer layer BFL has the multilayer structure, the respective layers may be formed of a same material or different materials. In an embodiment, the buffer layer BFL may be omitted, such as depending on a material of the substrate SUB or processing conditions.

The first transistor T1 may be a driving transistor which is electrically coupled to the first light emitting element LD1 to drive the first light emitting element LD1. The second transistor T2 may be a switching transistor which is electrically coupled to the first transistor T1 to switch the first transistor T1.

Each of the first and second transistors T1 and T2 may include a semiconductor layer SCL, a gate electrode GE, a source electrode SE, and a drain electrode DE.

The semiconductor layer SCL may be provided on the buffer layer BFL. The semiconductor layer SCL may include a source area and a drain area which respectively come into contact with the corresponding source electrode SE and the corresponding drain electrode DE. An area between the source area and the drain area may be a channel area. The semiconductor layer SCL may be a semiconductor pattern formed of polysilicon, amorphous silicon, an oxide semiconductor, etc. The channel area may be a semiconductor pattern doped with an impurity. The impurity may be an impurity such as any of an n-type impurity, a p-type impurity, or other metals.

The gate electrode GE may be provided on the corresponding semiconductor layer SCL with a first gate insulating layer GI1 interposed therebetween.

The source electrode SE and the drain electrode DE that are included in the first transistor T1 may be respectively coupled to the source area and the drain area of the corresponding semiconductor layer SCL through contact holes passing through the second gate insulating layer GI2 and the first gate insulating layer GI1.

The source electrode SE and the drain electrode DE that are included in the second transistor T2 may be respectively coupled to the source area and the drain area of the corresponding semiconductor layer SCL through contact holes passing through the second gate insulating layer GI2 and the first gate insulating layer GI1.

Although the driving voltage line DVL may be provided on the interlayer insulating layer ILD, the position of the driving voltage line DVL is not limited thereto. The driving voltage line may be coupled to the second driving power supply (see VSS of FIGS. 2A and 2B), and a signal corresponding to driving voltage may be supplied from a driver to the driving voltage line DVL.

The pixel circuit layer PCL may further include a passivation layer PSV that covers the first and second transistors T1 and T2. The passivation layer PSV may be provided to include an organic insulating layer, an inorganic insulating layer, or an organic insulating layer disposed on the inorganic insulating layer. Here, the inorganic insulating layer may include at least one of silicon oxide SiOx, silicon nitride SiNx, silicon oxynitride SiON, and a metal oxide, such as AlOx. The organic insulating layer may include organic insulating material that may transmit light. The organic insulating layer may include, for example, at least one of a polyacrylate resin, an epoxy resin, a phenolic resin, a polyamide resin, a polyimide rein, an unsaturated polyester resin, a poly-phenylene ether resin, a poly-phenylene sulfide resin, and a benzocyclobutene resin.

Further, there has been illustrated a case in which the transistors T1 and T2 are a thin film transistor having a top gate structure, but the present disclosure is not limited thereto. According to an embodiment, the transistors T1 and T2 may be a thin film transistor having a bottom gate structure.

Referring to FIG. 17, the display element layer DPL may include the first and second banks BNK1 and BNK2, the first and second electrodes EL1 and EL2, the first light emitting element LD1, the first and second contact electrodes CNT1 and CNT2, the bank pattern BNKP, the first dummy electrode DEL1, the 2-1th dummy electrode DEL2-1, the second light emitting element LD2, the first and second dummy contact electrodes DCNT1 and DCNT2, the insulating layer INS, and the insulating pattern INSP. Although not illustrated in FIG. 17, the display element layer DPL may further include first and second dummy banks DBNK1 and DBNK2 provided on the dummy area DA. In an embodiment, the 2-1th dummy electrode DEL2-1 illustrated in FIG. 17 may have the same configuration as the second dummy electrode DEL2 described with reference to FIGS. 4 and 5.

The first electrode EL1 may be provided on the first bank BNK1, and the second electrode EL2 may be provided on the second bank BNK2. In an embodiment, the shape of the first electrode EL1 may correspond to the shape of the first bank BNK1, and the shape of the second electrode EL2 may correspond to the shape of the second bank BNK2. The first electrode EU may include a first protrusion VP1 that protrudes towards the second electrode EL2, and the second electrode EL2 may include a second protrusion VP2 that protrudes towards the first electrode EL1.

One of the first and second electrodes EL1 and EL2 may be electrically coupled to at least one of the plurality of transistors included in the pixel circuit layer PCL.

For example, the second electrode EL2 may be electrically coupled to the drain electrode DE of the first transistor T1 via the contact holes passing through the passivation layer PSV and the interlayer insulating layer ILD. The source electrode SE of the first transistor T1 may be electrically coupled to the first driving power supply (see VDD of FIGS. 2A and 2B). Thereby, the second electrode EL2 may receive a signal from the first transistor T1.

The first electrode EL1 may be electrically coupled to the driving voltage line DVL through the contact hole formed through the passivation layer PSV. The driving voltage line may be electrically coupled to the second driving power supply VSS. Thereby, the first electrode EL1 may receive a signal from the driving voltage line DVL.

The insulating layer INS may be provided on a surface of the passivation layer PSV on which the first and second banks BNK1 and BNK2 and the first and second electrodes EL1 and EL2 are provided. The first light emitting element LD1 may be provided on the insulating layer INS.

The insulating pattern INSP may be provided on the first light emitting element LD1, thus fixing the position of the first light emitting element LD1. One end and the other end of the first light emitting element LD1 may be exposed by the insulating pattern INSP.

The first and second contact electrodes CNT1 and CNT2 may be provided on the insulating layer INS, one end of the first light emitting element LD1 exposed by the insulating pattern INSP may come into contact with the first contact electrode CNT1, and the other end of the first light emitting element LD1 exposed by the insulating pattern INSP may come into contact with the second contact electrode CNT2. Further, through a contact hole formed through the insulating layer INS, the first contact electrode CNT1 and the first electrode EL1 may be coupled to each other, and the second contact electrode CNT2 and the second electrode EL2 may be coupled to each other.

Thus, the first light emitting element LD1 may be subjected to a certain voltage (e.g., a predetermined voltage) through the first electrode EL1 and the second electrode EL2. If an electric field of a certain voltage (e.g., a predetermined voltage) is applied to both ends of the first light emitting element LD1, the first light emitting element LD1 emits light while an electron-hole pair is coupled in the active layer 12 of the first light emitting element LD1.

Further, as the first contact electrode CNT1 is coupled to the first electrode EL1 and the second contact electrode CNT2 is coupled to the second electrode EL2, the line resistance of each of the first and second contact electrodes CNT1 and CNT2 may be reduced, such that a driving failure of the first light emitting element LD1 due to a signal delay can be minimized or reduced.

Light emitted from both ends of the first light emitting element LD1 may be reflected by the first and second electrodes EL1 and EL2 to be guided upwards (e.g., a front direction) in the third direction DR3.

As illustrated in FIG. 17, the first dummy electrode DEL1 and the 2-1th dummy electrode DEL2-1 may be provided on the passivation layer PSV overlapping the dummy area DA of the substrate. The second light emitting element LD2 may be provided on the insulating layer INS, one end of the second light emitting element LD2 may be coupled to the first dummy contact electrode DCNT1, and the other end thereof may be coupled to the second dummy contact electrode DCNT2. Through a contact hole formed through the insulating layer INS, the first dummy contact electrode DCNT1 and the first dummy electrode DEL1 may be coupled to each other, and the second dummy contact electrode DCNT2 and the 2-1th dummy electrode DEL2-1 may be coupled to each other.

The first dummy electrode DEL1 and the 2-1th dummy electrode DEL2-1 may be provided without being electrically coupled to a plurality of transistors included in the pixel circuit layer PCL. That is, the second light emitting element LD2 does not emit light when the display device is driven. The dummy area DA may correspond to a non-light-emitting area.

The encapsulation layer INC may be provided on the passivation layer PSV in which the first and second electrodes EU and EL2, the first and second contact electrodes CNT1 and CNT2, the first light emitting element LD1, the first dummy electrode DEL1, the 2-1th dummy electrode DEL2-1, the first and second dummy contact electrodes DCNT1 and DCNT2, and the second light emitting element LD2 are provided. In an embodiment, an overcoat layer (not illustrated) may be provided on the encapsulation layer INC. The overcoat layer may be an encapsulating layer provided to prevent or substantially prevent oxygen, water, or the like from penetrating into the light emitting elements LD.

FIGS. 18A to 18G are plan views illustrating (e.g., sequentially illustrating) a method of fabricating a display device in accordance with an embodiment of the present disclosure. Particularly, FIGS. 18A to 18G are plan views illustrating (e.g., sequentially illustrating) a method of fabricating the display device including the display element layer DPL configured such that the first and second dummy electrodes DEL1 and DEL2 have a shape corresponding to that of the first and second electrodes EU and EL2.

Referring to FIG. 18A, the substrate SUB may include a display area AA and a non-display area NAA around (e.g., enclosing) the display area AA. The non-display area NAA may include a dummy area DA that is located on at least a side of the display area AA.

As illustrated in FIG. 18A, the first bank BNK1 and the second bank BNK2 that extend in the first direction DR1 and are spaced apart from each other in the second direction DR2 may be formed on the display area AA of the substrate SUB. The bank pattern BNKP extending in the first direction DR1 may be formed on the display area AA adjacent to the dummy area DA. The first dummy bank DBNK1 and the second dummy bank DBNK2 that extend in the first direction DR1 and are spaced apart from each other in the second direction DR2 may be formed on the dummy area DA of the substrate SUB.

Figure 18B:
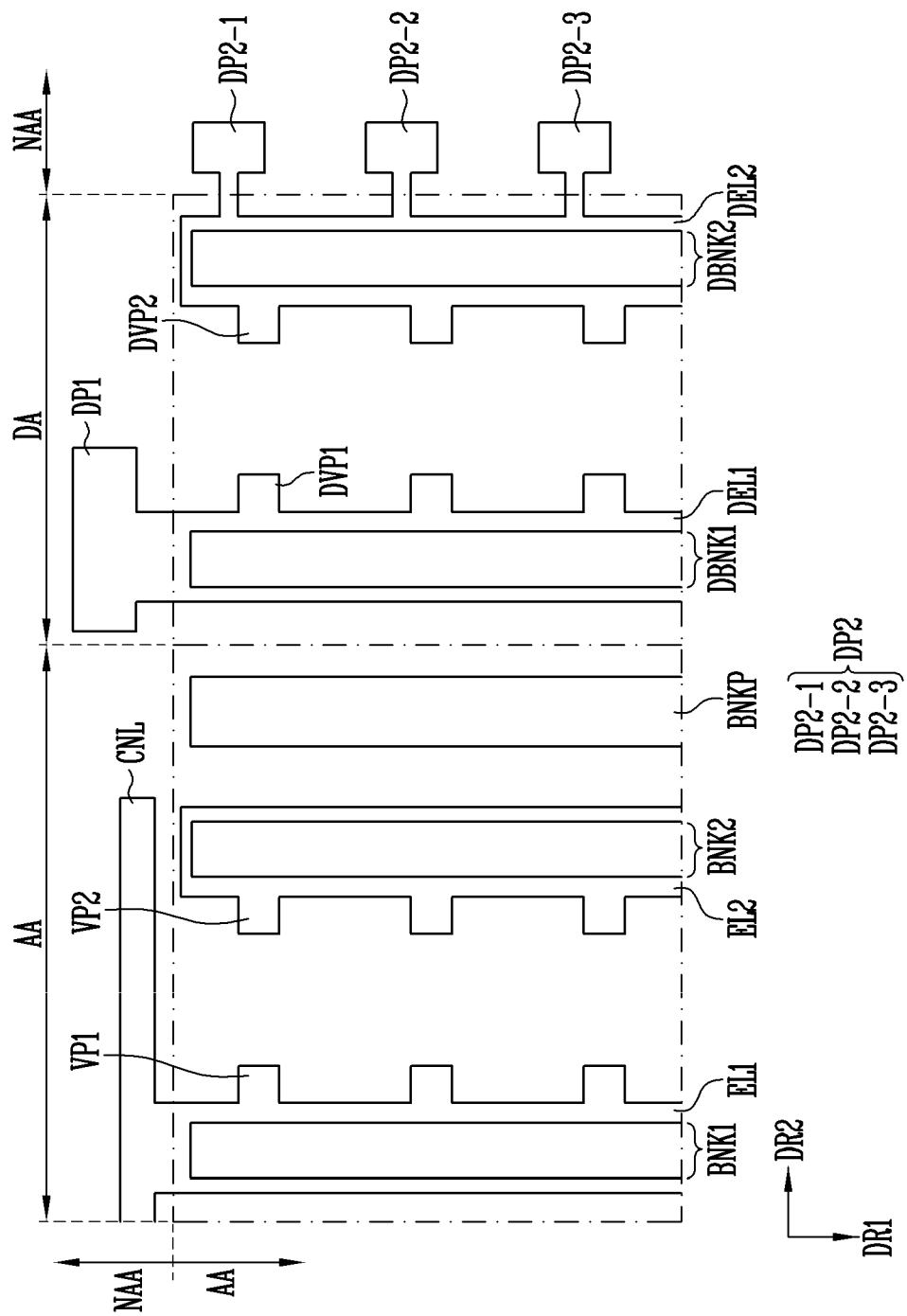

As illustrated in FIG. 18B, the first electrode EU may be formed on the first bank BNK1, and the second electrode EL2 may be formed on the second bank BNK2. Thereby, the first electrode EL1 and the second electrode may extend on the display area AA in the first direction DR1, and may be spaced apart from each other in the second direction DR2.

The first electrode EL1 may be coupled to a coupling line CNL, or be formed integrally with the coupling line CNL. The coupling line CNL may be electrically coupled to the above-described driving voltage line DVL.

The first dummy electrode DEL1 may be formed on the first dummy bank DBNK1, and the second dummy electrode DEL2 may be formed on the second dummy bank DBNK2. Thereby, the first dummy electrode DEL1 and the second dummy electrode DEL2 may extend on the dummy area DA in the first direction DR1, and may be spaced apart from each other in the second direction DR2.

In various embodiments of the present disclosure, a step of forming the first and second dummy electrodes DEL1 and DEL2 may form the first dummy pad DP1 electrically coupled to the first dummy electrode DEL1, and the second dummy pad DP2 electrically coupled to the second dummy electrode DEL2.

The first dummy pad DP1 may be coupled to the first dummy electrode DEL1, or may be formed integrally with the first dummy electrode DEL1. Further, the second dummy pads DP2 may be coupled to the second dummy electrode DEL2, or may be formed integrally with the second dummy electrode DEL2.

As illustrated in FIG. 18B, the coupling line CNL, the first dummy pad DP1, and the second dummy pads DP2 may be formed on the non-display area NAA. The first dummy pad DP1 and the second dummy pads DP2 may be formed on the non-display area NAA adjacent to the dummy area DA.

In various embodiments of the present disclosure, a first protrusion VP1 that protrudes towards the second electrode EL2 may be formed on the first electrode EU, and a second protrusion VP2 that protrudes towards the first electrode EL1 may be formed on the second electrode EL2. Further, a first dummy protrusion DVP1 that protrudes towards the second dummy electrode DEL2 may be formed on the first dummy electrode DEL1, and a second dummy protrusion DVP2 that protrudes towards the first dummy electrode DEL1 may be formed on the second dummy electrode DEL2.

The first protrusion VP1 and the second protrusion VP2 may be formed to face each other. As the first protrusion VP1 and the second protrusion VP2 face each other, an electric field may concentrate between the first protrusion VP1 and the second protrusion VP2. Thus, the first light emitting element LD1 may be effectively aligned between the first protrusion VP1 and the second protrusion VP2.

The first dummy protrusion DVP1 and the second dummy protrusion DVP2 may also be formed to face each other. As described above, the second light emitting element LD2 may be effectively aligned between the first dummy protrusion DVP1 and the second dummy protrusion DVP2.

Although not illustrated in FIGS. 18A to 18G, a first bank protrusion (not illustrated) that protrudes towards the second bank BNK2 may be formed on the first bank BNK1, and a second bank protrusion (not illustrated) that protrudes towards the first bank BNK1 may be formed on the second bank BNK2. Here, the first electrode EL1 may be formed on the first bank BNK1 such that the first protrusion VP1 overlaps in the shape corresponding to the planar shape of the first bank protrusion. Further, the second electrode EL2 may be formed on the second bank BNK2 such that the second protrusion VP2 overlaps in the shape corresponding to the planar shape of the second bank protrusion.

In an embodiment, a first dummy bank protrusion (not illustrated) that protrudes towards the second dummy bank DBNK2 may be formed on the first dummy bank DBNK1, and a second dummy bank protrusion (not illustrated) that protrudes towards the first dummy bank DBNK1 may be formed on the second dummy bank DBNK2. Here, the first dummy electrode DEL1 may be formed on the first dummy bank DBNK1 such that the first dummy protrusion DVP1 overlaps in the shape corresponding to the planar shape of the first dummy bank protrusion. Further, the second dummy electrode DEL2 may be formed on the second dummy bank DBNK2 such that the second dummy protrusion DVP2 overlaps in the shape corresponding to the planar shape of the second dummy bank protrusion.

The insulating layer INS may be formed on the substrate SUB on which the first and second electrodes EU and EL2 and the first and second dummy electrodes DEL1 and DEL2 are formed. The insulating layer INS may be formed to cover the first and second electrodes EL1 and EL2 and the first and second dummy electrodes DEL1 and DEL2.

Figure 18C:
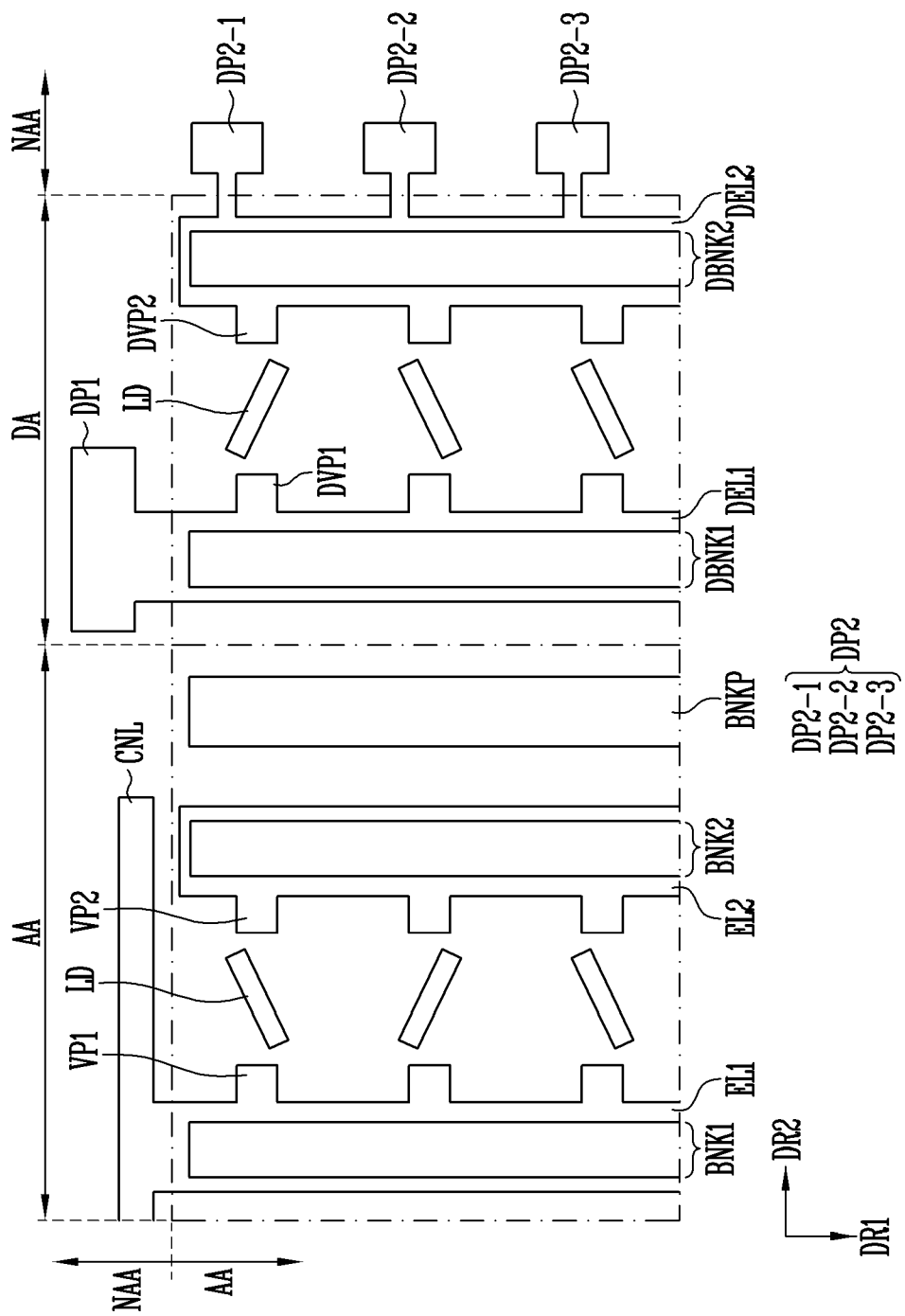

Referring to FIG. 18C, light emitting elements LD may be provided on the insulating layer INS. For example, the light emitting elements LD may be provided on the emission area and the dummy area DA of each of the pixels PXL through an inkjet printing method, a slit coating method, or any of other various methods. For example, the light emitting elements LD may be mixed with a volatile solvent and then supplied to the emission area and the dummy area DA of each of the pixels PXL by an inkjet printing method or a slit coating method.

For example, an inkjet nozzle may be disposed on the insulating layer INS, and a solvent in which the plurality of light emitting elements LD is mixed through the inkjet nozzle may be provided on the emission area and the dummy area DA of each of the pixels PXL. In an embodiment, the solvent may be any one of acetone, water, alcohol, and toluene, but the present disclosure is not limited thereto. For example, the solvent may have the form of an ink or a paste. However, a method of providing the light emitting elements LD on the emission area and the dummy area DA of each of the pixels PXL is not limited to the above-described embodiment. That is, the method of providing the light emitting elements LD may be changed in various ways. The emission area of each of the pixels PXL may be one area of the display area AA, for example, a pixel area in which each pixel PXL is provided. The emission area may be an area where light is emitted by the light emitting elements LD provided in the display area AA, but the present disclosure is not limited thereto.

After the light emitting elements LD are provided on the emission area and the dummy area DA of each of the pixels PXL, the solvent may be removed.

Figure 18D:
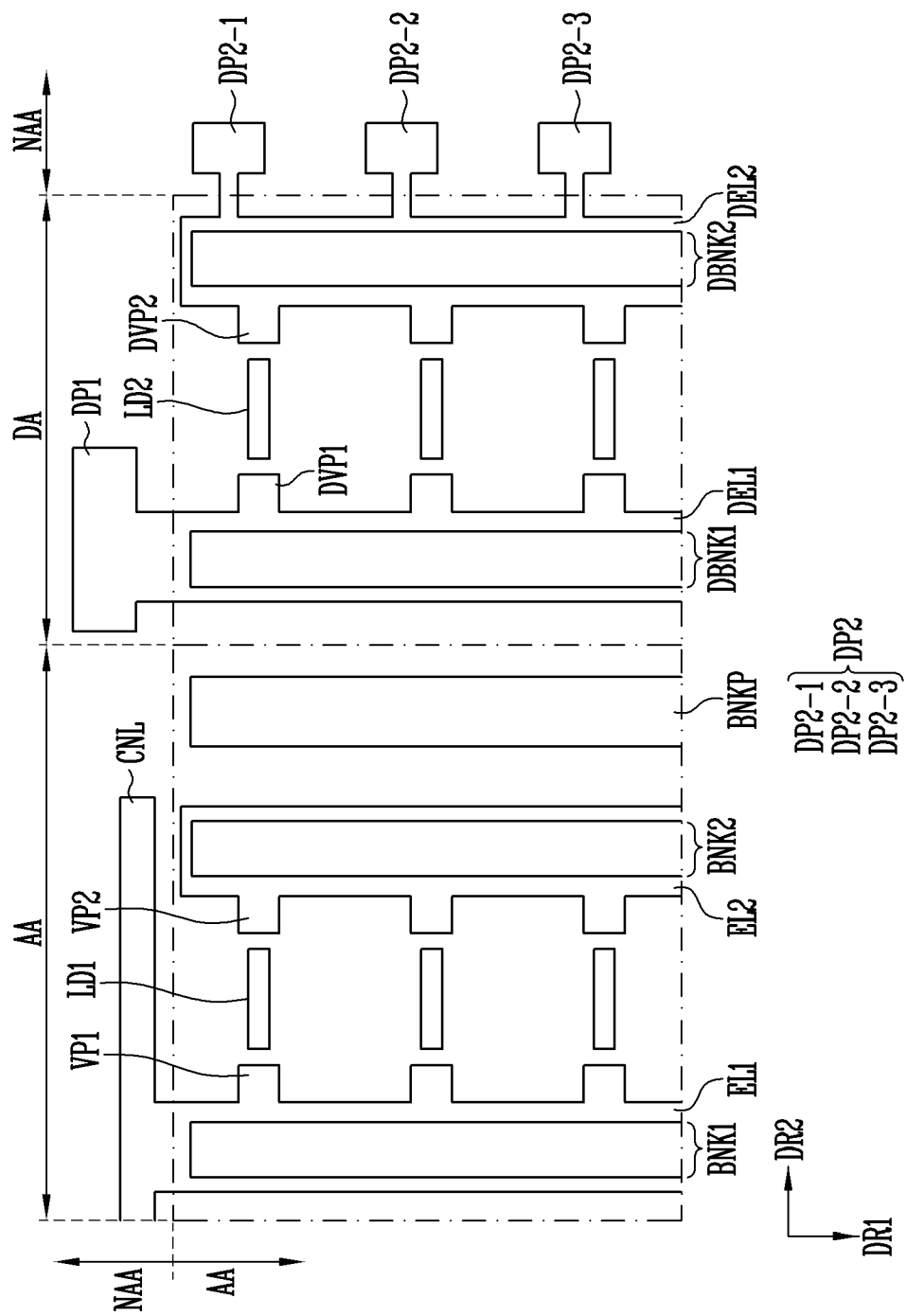

Referring to FIGS. 18C and 18D, an alignment signal may be applied to the first and second electrodes EU and EL2 to align the first light emitting element LD1 between the first and second electrodes EL1 and EL2.

A first alignment signal applied to the first electrode EL1 and a second alignment signal applied to the second electrode EL2 may be signals having a voltage difference and/or a phase difference such that the first light emitting element LD1 may be aligned between the first electrode EL1 and the second electrode EL2. For example, the first alignment signal and the second alignment signal may have different voltage levels. Further, at least some of the first alignment signal and the second alignment signal may be AC signals, but the present disclosure is not limited thereto.

Further, when the light emitting elements LD are aligned, the first light emitting element LD1 may be aligned to be relatively deflected between the first electrode EL1 and the second electrode EL2, by controlling the alignment signal (or alignment voltage) applied to the first electrode EL1 and the second electrode EL2 or forming a magnetic field. For example, the first light emitting element LD1 may be deflected such that one end thereof faces the first electrode EL1 and the other end thereof faces the second electrode EL2. In contrast, the first light emitting element LD1 may be deflected such that one end thereof faces the second electrode EL2 and the other end thereof faces the first electrode EL1.

Further, by applying the alignment signal to the first and second dummy electrodes DEL1 and DEL2, the second light emitting element LD2 may be aligned between the first and second dummy electrodes DEL1 and DEL2. The method of aligning the second light emitting element LD2 between the first and second dummy electrodes DEL1 and DEL2 may be the same as the method of aligning the first light emitting element LD1 between the first and second electrodes EL1 and EL2.

As the alignment signal is applied to the first and second electrodes EU and EL2, the first light emitting element LD1 may be aligned between the first protrusion VP1 and the second protrusion VP2. Further, as the alignment signal is applied to the first and second dummy electrodes DEL1 and DEL2, the second light emitting element LD2 may be aligned between the first dummy protrusion DVP1 and the second dummy protrusion DVP2.

In various embodiments of the present disclosure, the second sub dummy electrodes SDEL2 spaced apart from each other in the first direction DR1 may be formed by cutting the second dummy electrode DEL2. In an embodiment, some area of the insulating layer INS and some area of the second dummy electrode DEL2 may be cut together.

As illustrated in FIG. 18E, the second dummy electrode DEL2 may be cut such that a second light emitting element LD2 is provided between each of the second sub dummy electrodes SDEL2 and the first dummy electrode DEL1.

In an embodiment, a step of cutting the second dummy electrode DEL2 may cut the second dummy electrode DEL2 such that a second dummy protrusion DVP2 is provided on each of the second sub dummy electrodes SDEL2. Thereby, a second light emitting element LD2 may be provided between the first dummy protrusion DVP1 and the second dummy protrusion DVP2.

Further, as the second dummy electrode DEL2 is cut into a plurality of second sub dummy electrodes SDEL2, one second dummy pad DP2 may be provided on each of the second sub dummy electrodes SDEL2.

Figure 18F:
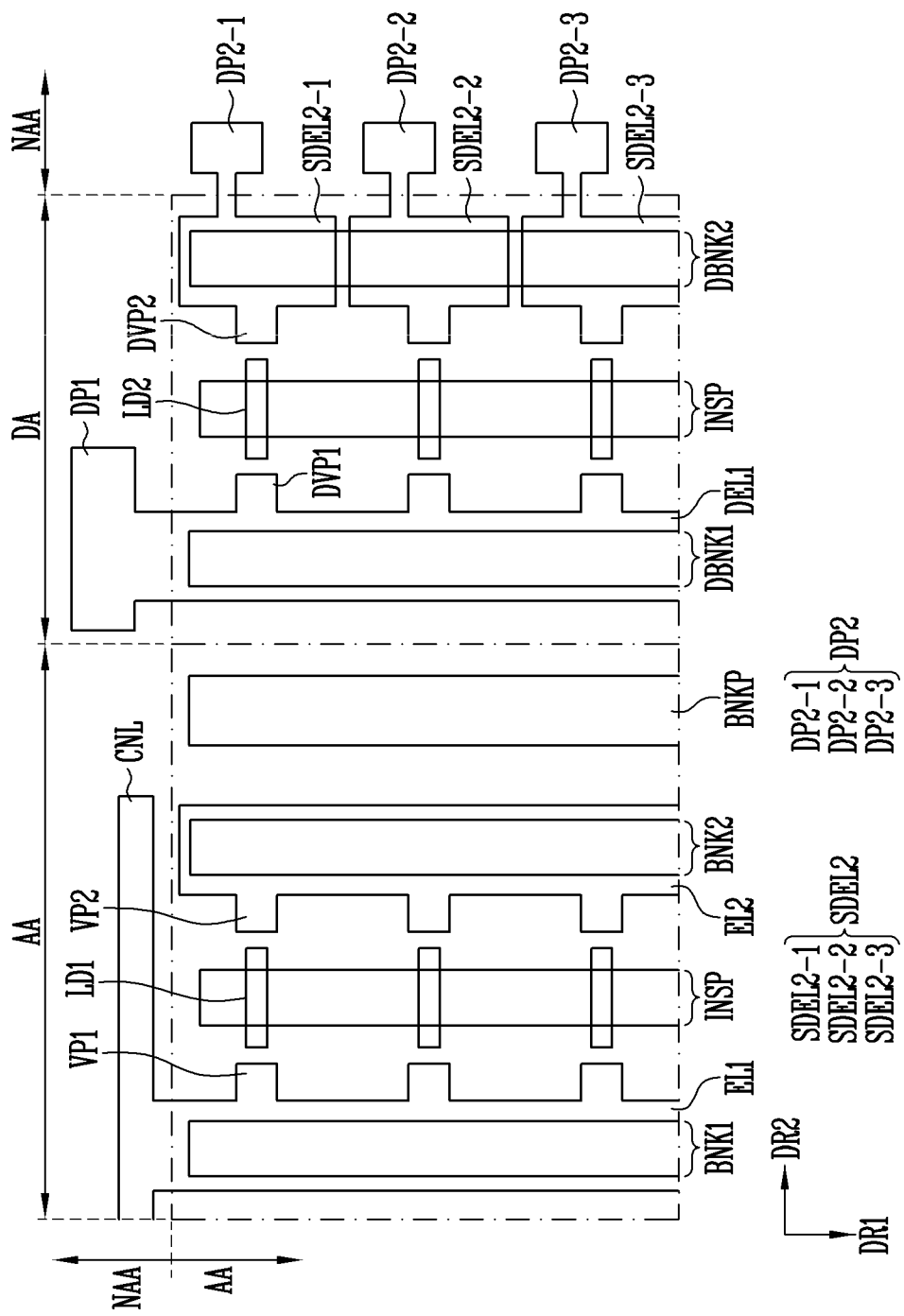

Referring to FIG. 18F, the insulating pattern INSP may be formed on the light emitting elements LD. In an embodiment, the insulating pattern INSP may be provided on the light emitting elements LD to be continuous in the first direction DR1. A first light emitting element LD1 aligned between the first electrode EU and the second electrode EL2, and a second light emitting element LD2 aligned between the first dummy electrode DEL1 and the second sub dummy electrode SDEL2 may be fixed in position by the insulating pattern INSP.

Figure 18G:
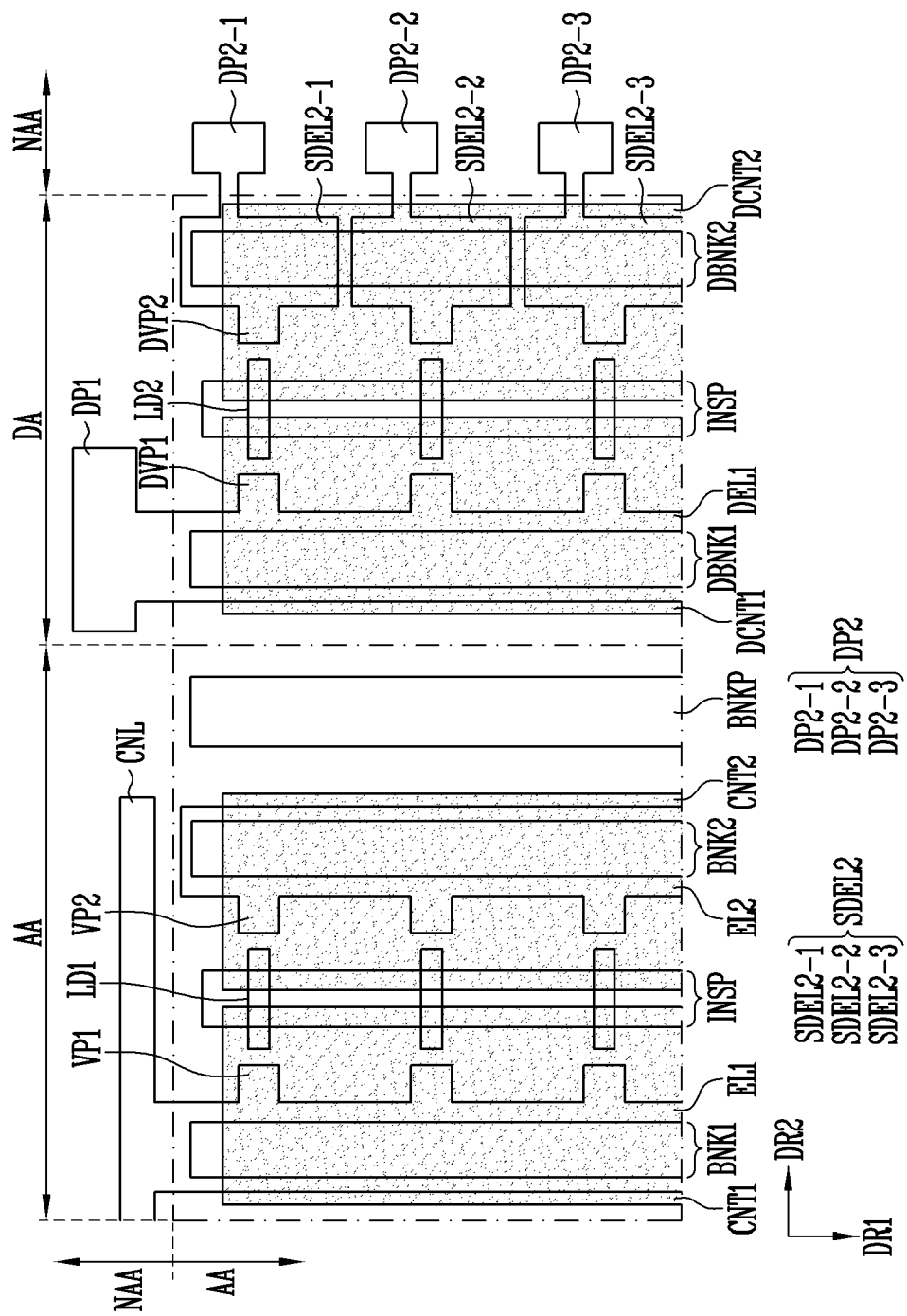

Referring to FIG. 18G, a first dummy contact electrode DCNT1 electrically coupling the first dummy electrode DEL1 to the second light emitting element LD2, and a second dummy contact electrode DCNT2 electrically coupling the second sub dummy electrode SDEL2 to the second light emitting element LD2 may be formed.

The first dummy contact electrode DCNT1 may be coupled to the first dummy electrode DEL1 via the contact hole formed through the insulating layer INS, and may come into contact with one end of the second light emitting element LD2 exposed by the insulating pattern INSP. Further, the second dummy contact electrode DCNT2 may be coupled to each of the second sub dummy electrodes SDEL2 via the contact hole formed through the insulating layer INS, and may come into contact with the other end of the second light emitting element LD2 exposed by the insulating pattern INSP. Thereby, the first dummy electrode DEL1 and the second sub dummy electrodes SDEL2 may be electrically coupled to the second light emitting element LD2.

The first contact electrode CNT1 that electrically couples the first electrode EL1 to the first light emitting element LD1, and the second contact electrode CNT2 that electrically couples the second electrode EL2 to the first light emitting element LD1 may be formed.

The first contact electrode CNT1 may be coupled to the first electrode EU via the contact hole formed through the insulating layer INS, and may come into contact with one end of the first light emitting element LD1 exposed by the insulating pattern INSP. Further, the second contact electrode CNT2 may be coupled to the second electrode EL2 via the contact hole formed through the insulating layer INS, and may come into contact with the other end of the first light emitting element LD1 exposed by the insulating pattern INSP. Thereby, the first and second electrodes EL1 and EL2 may be electrically coupled to the first light emitting element LD1.

In various embodiments of the present disclosure, a step of measuring the contact resistance of the second light emitting element LD2 may apply the test signal to each of the first dummy pad DP1 and the second dummy pads DP2, and measure the signal outputted from each of the second light emitting elements LD2.

A first test signal applied to the first dummy pad DP1 and a second test signal applied to each of the second dummy pads DP2 may have different voltage levels. For example, the first test signal may have a higher voltage level than the second test signal. The first dummy pad DP1 may be coupled to the above-described first driving power supply VDD, and each of the second dummy pads DP2 may be coupled to the above-described second driving power supply VSS. Here, the first driving power supply VDD coupled to the first dummy pad DP1 and the second driving power supply VSS coupled to each of the second dummy pads DP2 may be provided outside the display device.

After the test signal is applied to each of the first dummy pad DP1 and the second dummy pads DP2, a signal outputted from each of the second light emitting elements LD2 may be measured, such that the contact resistance of each of the second light emitting elements LD2 may be calculated. For example, the contact resistance of each of the second light emitting elements LD2 may be calculated using a current value outputted from each of the second light emitting elements LD2.

As illustrated in FIGS. 4, 6, and 8, the first dummy electrode DEL1 and the second sub dummy electrodes SDEL2 having the shape corresponding to that of the first and second electrodes EU and EL2 provided on the display area AA may be formed on the dummy area DA. Subsequently, by measuring the contact resistance of each of the second light emitting elements LD2 that are electrically coupled to the first dummy electrode DEL1 and the second sub dummy electrodes SDEL2 on the dummy area DA, it is possible to monitor the contact resistance of the first light emitting element LD1 provided on the display area AA without separately measuring the contact resistance of the first light emitting element LD1.

In an embodiment, as illustrated in FIGS. 10 and 11, the first dummy electrode DEL1 and the second sub dummy electrode SDEL2 having the shape different from that of the first and second electrodes EL1 and EL2 provided on the display area AA may be formed on the dummy area DA. Subsequently, by measuring the contact resistance of each of the second light emitting elements LD2 that are electrically coupled to the first dummy electrode DEL1 and the second sub dummy electrodes SDEL2 on the dummy area DA, it is possible to measure the contact resistance of each of the second light emitting elements LD2 depending on the shape of the first dummy electrode DEL1 and the second sub dummy electrodes SDEL2.

As illustrated in FIG. 12, by setting various distances between the first dummy protrusion DVP1 and the second dummy protrusion DVP2 provided on the sub dummy areas SDA1 and SDA2, it is possible to measure the contact resistance of each of the second light emitting elements LD2 depending on a distance between the first dummy protrusion DVP1 and the second dummy protrusion DVP2.

As illustrated in FIG. 13, by setting various overlapping widths between the first dummy protrusion DVP1 and the second dummy protrusion DVP2 provided on the sub dummy areas SDA1 and SDA2, it is possible to measure the contact resistance of each of the second light emitting elements LD2 depending on an overlapping width of the first dummy protrusion DVP1 and the second dummy protrusion DVP2.

Therefore, according to an embodiment of the present disclosure, by measuring the contact resistance of each of the second light emitting elements LD2 provided on the dummy area DA, the electrical environment of the first light emitting element LD1 provided on the display area AA may be monitored, or a change in contact resistance of the second light emitting element LD2 may be easily observed depending on the shape of the first and second dummy electrodes DEL1 and DEL2.

According to embodiments of the present disclosure, a display device that can easily measure the contact resistance of light emitting elements and a method of fabricating such a display device are provided.

According to embodiments of the present disclosure, it is possible to easily measure the resistance of each of light emitting elements, using dummy electrodes provided in a dummy area and second light emitting elements.

However, aspects and effects of the present disclosure are not limited to the above-described aspects and effects, and various modifications are possible without departing from the spirit and scope of the present disclosure.

The foregoing descriptions of some example embodiments may illustrate and describe the present invention. However, the foregoing descriptions merely illustrate and describe some example embodiments of the present disclosure. As described above, the present disclosure may be used in various different combinations, modifications and environments, and may be changed or modified within the scope of the inventive concept disclosed in this specification, the scope equivalent to the above-described description, and/or the scope of technology or knowledge of the art. Therefore, the description is not intended to limit the invention to the form disclosed herein.

What is claimed is:

1. A display device comprising:
    a substrate comprising a display area and a non-display area around the display area; and
    a display element layer on the substrate,
    wherein the display element layer comprises:
    first and second electrodes extending in a first direction, and spaced apart from each other in a second direction that is different from the first direction;
    a first light emitting element electrically coupled to the first and second electrodes;
    a first dummy electrode extending in the first direction, and spaced apart from the first and second electrodes;
    second dummy electrodes spaced apart from each other in the first direction, and spaced apart from the first electrode, the second electrode, and the first dummy electrode; and
    a second light emitting element electrically coupled to the first dummy electrode and the second dummy electrodes,
    wherein the non-display area comprises a dummy area located at at least one side of the display area,
    wherein the first and second electrodes and the first light emitting element are on the display area, and
    wherein the first dummy electrode, the second dummy electrodes, and the second light emitting element are on the dummy area.

2. The display device according to claim 1,
    wherein the first electrode comprises a first protrusion protruding towards the second electrode,
    wherein the second electrode comprises a second protrusion protruding towards the first electrode, and
    wherein the first light emitting element is between the first protrusion and the second protrusion.

3. The display device according to claim 2,
    wherein the first dummy electrode comprises a first dummy protrusion protruding towards each of the second dummy electrodes, and
    wherein each of the second dummy electrodes comprises a second dummy protrusion protruding towards the first dummy electrode.

4. The display device according to claim 3,
    wherein the first dummy protrusion has a planar shape corresponding to a planar shape of the first protrusion, and
    wherein the second dummy protrusion has a planar shape corresponding to a planar shape of the second protrusion.

5. The display device according to claim 3,
wherein the planar shape of the first dummy protrusion is different from the planar shape of the first protrusion, and
wherein the planar shape of the second dummy protrusion is different from the planar shape of the second protrusion.

6. The display device according to claim 3, wherein the second light emitting element is between the first dummy protrusion and the second dummy protrusion.

7. The display device according to claim 3,
wherein the dummy area comprises sub dummy areas that are spaced apart from each other in the first direction, and
wherein the second light emitting element is arranged in each of the sub dummy areas.

8. The display device according to claim 7, wherein a shape of the first and second dummy protrusions arranged in at least one of the sub dummy areas is different from a shape of the first and second dummy protrusions arranged in a remaining area of the sub dummy areas.

9. The display device according to claim 7, wherein a distance between the first dummy protrusion and the second dummy protrusion arranged in at least one of the sub dummy areas to be spaced apart from each other in the second direction is different from a distance between the first dummy protrusion and the second dummy protrusion arranged in a remaining area of the sub dummy areas to be spaced apart from each other in the second direction.

10. The display device according to claim 7, wherein a width of a portion where the first dummy protrusion arranged in at least one of the sub dummy areas faces the second dummy protrusion on a plane is different from a width of a portion where the first dummy protrusion arranged in a remaining area of the sub dummy areas faces the second dummy protrusion on a plane.

11. The display device according to claim 1, wherein the second light emitting element is between each of the second dummy electrodes and the first dummy electrode.

12. The display device according to claim 1,
wherein the first dummy electrode comprises first sub dummy electrodes spaced apart from each other in the first direction, and
wherein the second light emitting element is between each of the first sub dummy electrodes and each of the second dummy electrodes.

13. The display device according to claim 1, wherein the display element layer further comprises a first dummy pad electrically coupled to the first dummy electrode, and second dummy pads electrically coupled to the second dummy electrodes, respectively.

14. The display device according to claim 1, wherein the display element layer further comprises:
a first dummy contact electrode covering at least a portion of the first dummy electrode, and electrically coupling the first dummy electrode to the second light emitting element; and
a second dummy contact electrode covering at least a portion of the second dummy electrodes, and electrically coupling the second dummy electrodes to the second light emitting element.

15. A method of fabricating a display device, the method comprising:
forming, on a substrate, a first electrode, a second electrode, a first dummy electrode, and a second dummy electrode that extend in a first direction and are spaced apart from each other in a second direction different from the first direction;
providing light emitting elements on the substrate including the first and second electrodes and the first and second dummy electrodes formed thereon;
applying an alignment signal to the first and second electrodes to align a first light emitting element of the light emitting elements between the first and second electrodes, and applying an alignment signal to the first and second dummy electrodes to align a second light emitting element of the light emitting elements between the first and second dummy electrodes;
cutting the second dummy electrode to form second sub dummy electrodes spaced apart from each other in the first direction;
forming a first dummy contact electrode that electrically couples the first dummy electrode to the second light emitting element, and a second dummy contact electrode that electrically couples the second sub dummy electrodes to the second light emitting element; and
measuring contact resistance of the second light emitting element,
wherein the substrate comprises a display area and a non-display area around the display area,
wherein the non-display area comprises a dummy area located at at least one side of the display area,
wherein the first and second electrodes and the first light emitting element are on the display area, and
wherein the first dummy electrode, the second dummy electrode, and the second light emitting element are on the dummy area.

16. The method according to claim 15, wherein the second light emitting element is between each of the second sub dummy electrodes and the first dummy electrode.

17. The method according to claim 15, wherein the forming of the first and second dummy electrodes comprises:
forming, on the first dummy electrode, a first dummy protrusion protruding towards the second dummy electrode, and
forming, on the second dummy electrode, a second dummy protrusion protruding towards the first dummy electrode.

18. The method according to claim 17, wherein the cutting of the second dummy electrode comprises:
cutting the second dummy electrode to provide a respective second dummy protrusion on each of the second sub dummy electrodes,
wherein the second light emitting element is between the first dummy protrusion and the second dummy protrusion.

19. The method according to claim 15,
wherein the forming of the first and second dummy electrodes comprises forming a first dummy pad electrically coupled to the first dummy electrode, and second dummy pads electrically coupled to the second dummy electrode, and
wherein the cutting of the second dummy electrode comprises cutting the second dummy electrode to provide a respective second dummy pad on each of the second sub dummy electrodes.

20. The method according to claim 19, wherein the measuring of the contact resistance of the second light emitting element comprises:

applying a test signal to each of the first dummy pad and the second dummy pads, and measuring a signal outputted from the second light emitting element.

* * * * *